(12) United States Patent
Cannon et al.

(10) Patent No.: US 7,965,540 B2
(45) Date of Patent: Jun. 21, 2011

(54) STRUCTURE AND METHOD FOR IMPROVING STORAGE LATCH SUSCEPTIBILITY TO SINGLE EVENT UPSETS

(75) Inventors: Ethan H. Cannon, Essex Junction, VT (US); Toshiharu Furukawa, Essex Junction, VT (US); David Horak, Essex Junction, VT (US); Charles W. Koburger, III, Delmar, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 12/055,509

(22) Filed: Mar. 26, 2008

(65) Prior Publication Data
US 2009/0244954 A1 Oct. 1, 2009

(51) Int. Cl.
*G11C 11/412* (2006.01)
(52) U.S. Cl. . 365/156; 257/297; 257/302; 257/E27.098; 257/E29.346; 365/149; 365/181; 365/188
(58) Field of Classification Search .................. 257/297, 257/301, 302, E27.098, E27.095, E29.346; 365/149, 154, 156, 181, 188
See application file for complete search history.

(56) References Cited

U.S. PATENT DOCUMENTS

| | | | |
|---|---|---|---|
| 5,225,697 A * | 7/1993 | Malhi et al. | 257/302 |
| 5,324,961 A | 6/1994 | Rodder | |
| 5,905,290 A | 5/1999 | Houston | |
| 6,303,965 B1 | 10/2001 | Schuegraf | |
| 6,510,076 B1 | 1/2003 | Lapadat et al. | |
| 6,975,041 B2 | 12/2005 | Hirano et al. | |
| 7,110,281 B1 | 9/2006 | Voogel et al. | |
| 7,397,692 B1 * | 7/2008 | Cannon et al. | 365/154 |
| 2008/0048744 A1 * | 2/2008 | Fukuoka | 327/203 |

* cited by examiner

*Primary Examiner* — Anh Phung
*Assistant Examiner* — Michael Lulis
(74) *Attorney, Agent, or Firm* — Cantor Colburn LLP; Michael LeStrange

(57) ABSTRACT

A digital logic storage structure includes cross coupled first and second complementary metal oxide semiconductor (CMOS) inverters formed on a semiconductor substrate, the CMOS inverters including a first storage node and a second storage node that is the logical complement of the first storage node; both of the first and second storage nodes each selectively coupled to a deep trench capacitor through a switching transistor, with the switching transistors controlled by a common capacitance switch line coupled to gate conductors thereof; wherein, in a first mode of operation, the switching transistors are rendered nonconductive so as to isolate the deep trench capacitors from the inverter storage nodes and, in a second mode of operation, the switching transistors are rendered conductive so as to couple the deep trench capacitors to their respective storage nodes, thereby providing increased resistance of the storage nodes to single event upsets (SEUs).

3 Claims, 22 Drawing Sheets

STRUCTURE AND METHOD FOR IMPROVING STORAGE LATCH SUSCEPTIBILITY TO SINGLE EVENT UPSETS

CROSS-REFERENCE TO RELATED APPLICATIONS

This non-provisional U.S. patent application is with U.S. patent application Ser. No. 11/612,809, which was filed Dec. 19, 2006, and is assigned to the present assignee.

BACKGROUND OF THE INVENTION

The present invention relates generally to integrated circuit (IC) devices and, more particularly, to structure and method for improving storage latch susceptibility to single event upsets (SEUs).

The effects of radiation on integrated circuits have been known for many years. These effects may be broken down into two broad categories, namely "total dose effects," in which an integrated circuit gradually deteriorates due to the accumulated effect of all the damage done to the crystal structure by the many particles incident thereupon, and "single event effects" in which a single particle (either through its exceptionally high energy or through the accuracy of its trajectory through a semiconductor) is capable of affecting a circuit. Single event effects are varied, and most of the effects can be mitigated by proper layout techniques. One type of single-event effect that requires more effort to eliminate is the single event upset, or SEU, in which the contents of a memory cell are altered by an incident particle.

SEUs belong to a class of errors called "soft-errors" in that they simply reverse the logical state of devices such as storage latches. Although SEUs do not, in and of themselves, physically damage a circuit, they are capable of propagating through combinational logic and being stored in memory. In turn the operation of a circuit may be altered in such a way so as to cause an error in logic function, potentially crashing a computer system. SEUs present significant reliability concerns in terrestrial and space environments.

A number of SEU-hardening techniques have thus been developed. These techniques may be categorized into three general types: (1) technology hardening, in which changes are made to the fabrication processes of the chip such that a circuit is less likely to collect the critical charge required to reverse its state (e.g., using Silicon-on-Sapphire or SOS substrates to reduce the charge build-up due to incident particles); (2) passive hardening in which passive components such as capacitors or resistors are added to a circuit to either slow it down or to increase the charge required to reverse its state; and (3) design hardening in which redundancy and feedback elements are added to a circuit to make it more immune to single events.

Technology hardening is generally not commercially viable due to the expense associated with designing and improving existing fabrication methods, which can cost billions of dollars to develop in the first place. Moreover, passive hardening is not efficient. Although it is a workable solution, it represents a deliberate slowing-down of information processing, which is at odds with the clear industry objective to speed up processing. Passive hardening is also not scalable, meaning that fabrication changes necessarily result in passive hardening redesign and re-testing.

With respect to design hardening, various circuit solutions exist to reduce SEU sensitivity in SRAM cells and sequential logic circuits, such as adding series resistance to the cross-coupling, adding capacitance to internal storage nodes, and storing the data state on multiple internal nodes. However, all known architectural and circuit SEU mitigation techniques have area, performance and power penalties. Each application thus requires careful analysis to determine the tradeoff between the level of SEU protection and acceptable cost. There is great interest in SEU mitigation solutions with reduced area penalty (to avoid increases in chip cost) and power penalty (e.g. in mobile and space applications, where power consumption is a primary concern). However, conventional approaches to adding internal node capacitance have resulted in write performance degradation and/or circuit area penalties. Accordingly, there is a need to provide increased internal node capacitance of SRAM cells, latches, and other sequential logic circuits for SEU robustness, while at the same time minimizing degradation in performance due to the presence of the increased capacitance.

SUMMARY OF THE INVENTION

The foregoing discussed drawbacks and deficiencies of the prior art are overcome or alleviated, in an exemplary embodiment, by a digital logic storage structure including cross coupled first and second complementary metal oxide semiconductor (CMOS) inverters formed on a semiconductor substrate, the CMOS inverters including a first storage node and a second storage node that is the logical complement of the first storage node; both of the first and second storage nodes each selectively coupled to a deep trench capacitor through a switching transistor, with the switching transistors controlled by a common capacitance switch line coupled to gate conductors thereof; wherein, in a first mode of operation, the switching transistors are rendered nonconductive so as to isolate the deep trench capacitors from the inverter storage nodes and, in a second mode of operation, the switching transistors are rendered conductive so as to couple the deep trench capacitors to their respective storage nodes, thereby providing increased resistance of the storage nodes to single event upsets (SEUs).

In another embodiment, a static random access memory (SRAM) cell includes cross coupled first and second complementary metal oxide semiconductor (CMOS) inverters formed on a semiconductor substrate, the CMOS inverters including a first storage node and a second storage node that is the logical complement of the first storage node; a first access transistor coupled between the first storage node and a true data bit line, and a second access transistor coupled between the second storage node and a complement data bit line, the first and second access transistors activated by a word line coupled to gate conductors thereof; both of the first and second storage nodes each further selectively coupled to a deep trench capacitor through a switching transistor, with the switching transistors controlled by a common capacitance switch line coupled to gate conductors thereof; wherein, in a first mode of operation, the switching transistors are rendered nonconductive so as to isolate the deep trench capacitors from the inverter storage nodes and, in a second mode of operation, the switching transistors are rendered conductive so as to couple the deep trench capacitors to their respective storage nodes, thereby providing increased resistance of the storage nodes to single event upsets (SEUs).

In still another embodiment, a method of forming a digital logic storage structure includes forming cross coupled first and second complementary metal oxide semiconductor (CMOS) inverters on a semiconductor substrate, the CMOS inverters including a first storage node and a second storage node that is the logical complement of the first storage node;

forming a pair deep trench capacitors in the substrate, both of the first and second storage nodes each selectively coupled to a corresponding one of the deep trench capacitors through a switching transistor, with the switching transistors controlled by a common capacitance switch line coupled to gate conductors thereof; wherein, in a first mode of operation, the switching transistors are rendered nonconductive so as to isolate the deep trench capacitors from the inverter storage nodes and, in a second mode of operation, the switching transistors are rendered conductive so as to couple the deep trench capacitors to their respective storage nodes, thereby providing increased resistance of the storage nodes to single event upsets (SEUs).

BRIEF DESCRIPTION OF THE DRAWINGS

Referring to the exemplary drawings wherein like elements are numbered alike in the several Figures.

DETAILED DESCRIPTION OF THE INVENTION

Disclosed herein is a structure and method for improving storage latch susceptibility to single event upsets (SEUs). Briefly stated, the invention embodiments presented herein provide an SEU hardened structure with added internal node capacitance in a manner that avoids sacrificing performance. Since the added capacitance can be selectively connected to or disconnected from the true and complement internal nodes of an SRAM cell, or a flip-flop in logic sequential circuits, by a switching MOSFET, the performance is improved over conventional approaches where the added capacitance is not selectively removable. This is especially true for a write operation, as the read operation is not effected by additional capacitance. During a write operation, the capacitors may be disconnected from the internal nodes, thus improving SEU immunity without sacrificing write performance.

Moreover, from a device area perspective, the added capacitance is realized through the formation of deep trench (DT) capacitors. The associated switching MOSFETs may, in one embodiment, be a planar FET with respect to the substrate (as is the case with the other FETs of the storage cell) or, alternatively, the switching MOSFETs may be vertical transistors with respect to the substrate for a further area savings.

In the embodiments depicted herein, a static random access memory (SRAM) cell is used as an exemplary storage device to which the added internal node capacitance is applied. However, it will be appreciated that the inventive principles herein are also equally applicable to other types of digital logic storage devices such as, for example, latches and flip-flops.

Figure 1:
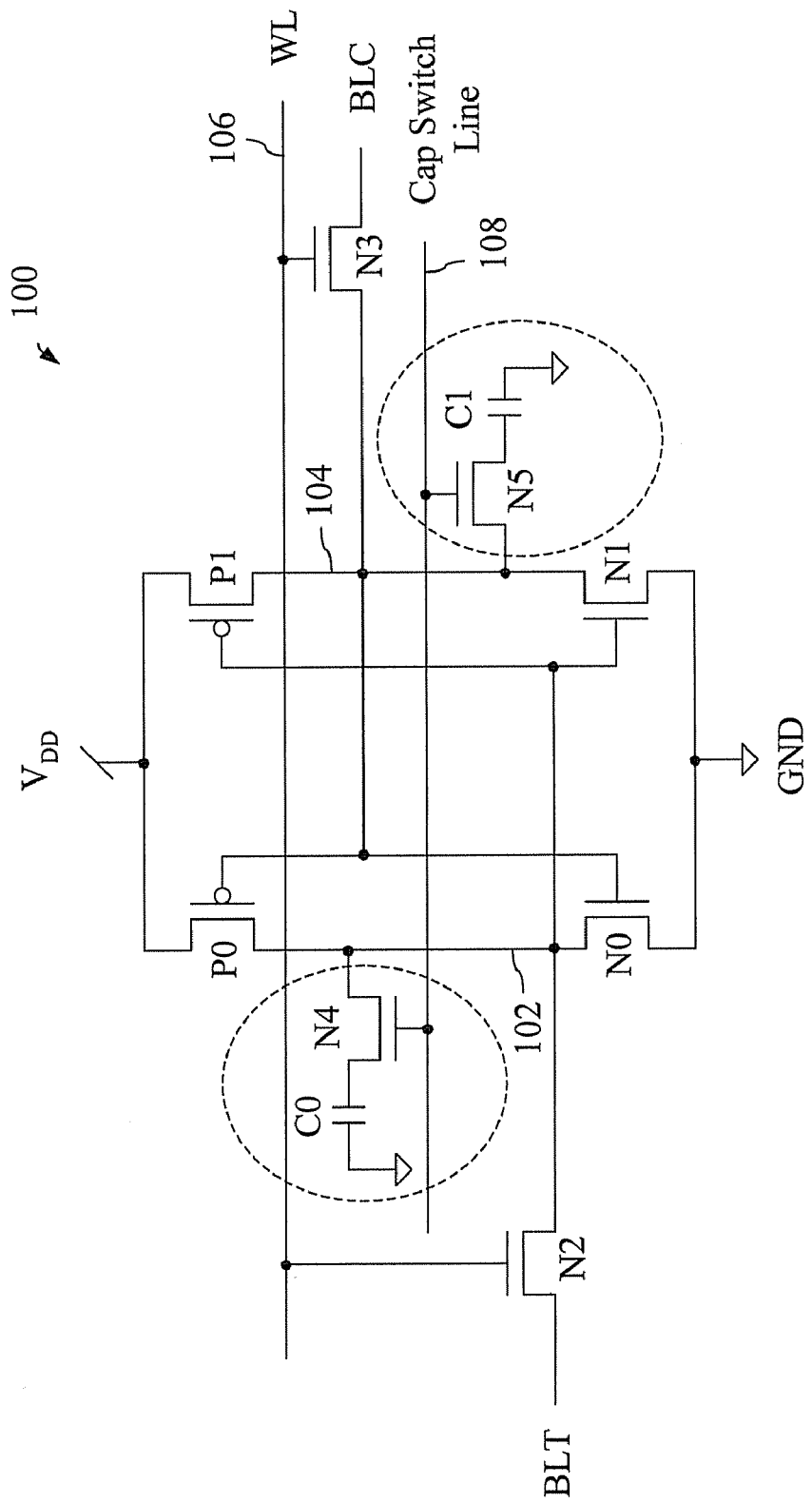
FIG. 1 is a schematic diagram of a static random access memory (SRAM) cell including selectively switchable capacitors associated with the storage nodes thereof, in accordance with an embodiment of the invention.

Referring initially to FIG. 1, there is shown a schematic diagram of a static random access memory (SRAM) cell 100 including selectively switchable capacitors associated with the storage nodes thereof, in accordance with an embodiment of the invention. As will be recognized, the cell 100 includes a pair of cross-coupled latches defined by transistors P0, N0, P1 and N1. One logical node 102 (e.g., the true data node) is defined by the series connection between P0 and N0, while the other logical node 104 (e.g., the complement data node) is defined by the series connection between P1 and N1. The gate terminals of P0 and N0 are controlled by the state of the complement data node 104, while the gate terminals of P1 and N1 are controlled by the state of the true data node 102, as is known in the art. In addition, access to the true and complement data nodes 102, 104 is provided by a pair of access transistors (or "pass gates"), such as N2 and N3, respectively. Both N2 and N3 are operated by a control signal provided on a word line (WL) 106. When the word line 106 is activated, N2 couples the true data node 102 to a true bit line (BLT) while N3 couples the complement data node 104 to a complement bit line (BLC).

In addition to the conventional SRAM components, cell 100 further includes a first deep trench (DT) capacitor C0 selectively coupled to the true data node 102 through NFET N4, as well as a second DT capacitor C1 selectively coupled to the complement data node 104 through NFET N5. The gate terminals of N4 and N5 are controlled by an SEU capacitance switch line 108 that, when activated, couples C0 and C1 to the true and complement data nodes 102, 104, respectively. By using switching transistors N4 and N5, the SRAM cell 100 can be switched from a first mode of operation (e.g., high-write performance) where the capacitors C0 and C1 are decoupled from the storage nodes to a second mode of operation (e.g., SEU tolerant) where the capacitors C0 and C1 are coupled to the storage nodes, thereby rendering the same more resistant to SEU events. In an exemplary embodiment, the capacitors C0, C1 provide about 40 femtoFarads (fF) of capacitance.

Figure 2:
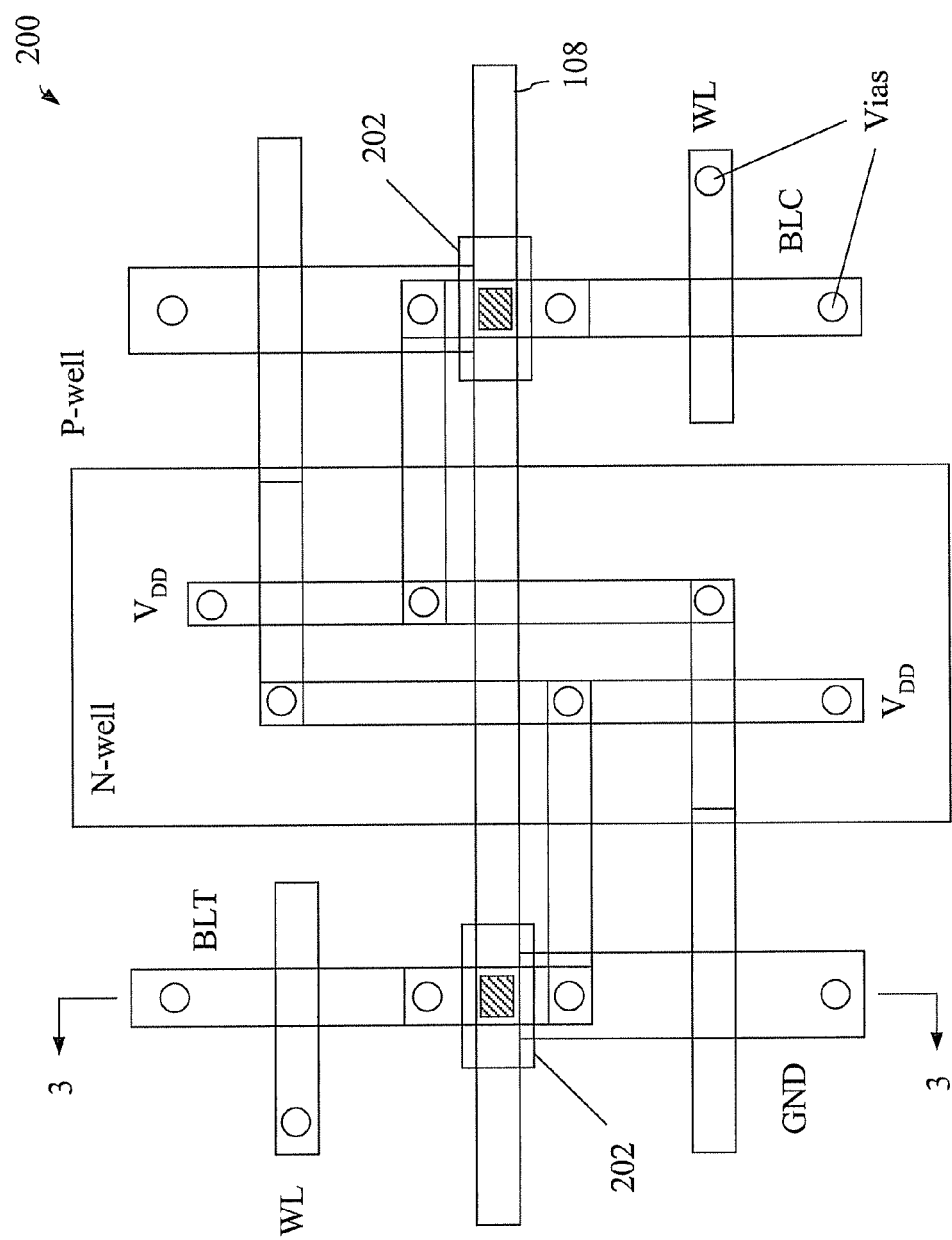
FIG. 2 is a layout view of one exemplary structural implementation of the SRAM cell of FIG. 1, wherein the switching transistors coupled to the node capacitors are vertical transistors.
Figure 3:
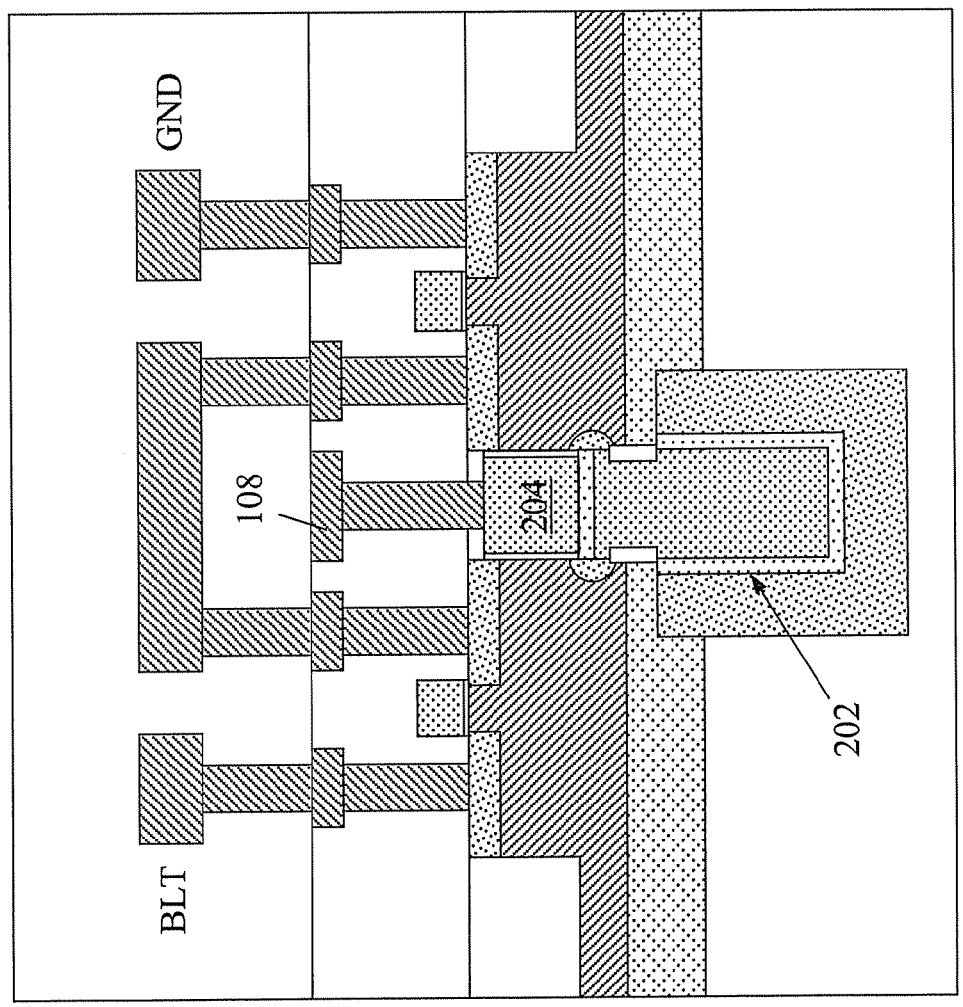
FIG. 3 is a cross sectional view of the SRAM cell of FIG. 2, taken along the lines 3-3 of FIG. 2.

Referring next to FIGS. 2 and 3, there is shown one exemplary structural implementation of the SRAM cell of FIG. 1, wherein the switching transistors coupled to the node capacitors are vertical transistors. FIG. 2 is a layout view of such a cell 200, while FIG. 3 is a cross sectional view of the cell 200 taken along the lines 3-3 in FIG. 2. As will be noted, the capacitance switch line 108 is disposed directly above the deep trenches 202 in which the capacitors C1, C2 reside, since the gate conductors 204 of the associated switching transistors (e.g., N4, N5) are also formed within the deep trenches 202. Certain wiring structures such as the capacitance switch line 108 are formed on one metal level (e.g., M1) while other wiring structures such as the word lines and bit lines are formed on another (e.g., M2), with metal filled vias used to make vertical connections between wiring levels, and to transistor structures (e.g., gate conductors, source and drain diffusion regions. The remaining device structures illustrated in FIG. 3 are discussed in further detail hereinafter in conjunction with an exemplary process flow for forming the same.

FIGS. 4(a) through 4(k) are a series of cross sectional views illustrating an exemplary process flow in forming the structure depicted in FIG. 3. It will be appreciated that although the exemplary process for forming the cell structure follows a standard process for embedded dynamic random access memory (eDRAM) technology in bulk CMOS, such process steps are also applicable to other substrates (e.g., silicon on insulator (SOI), hybrid oriented substrates, heterojunction substrates, etc.) as well.

Figure 4A:
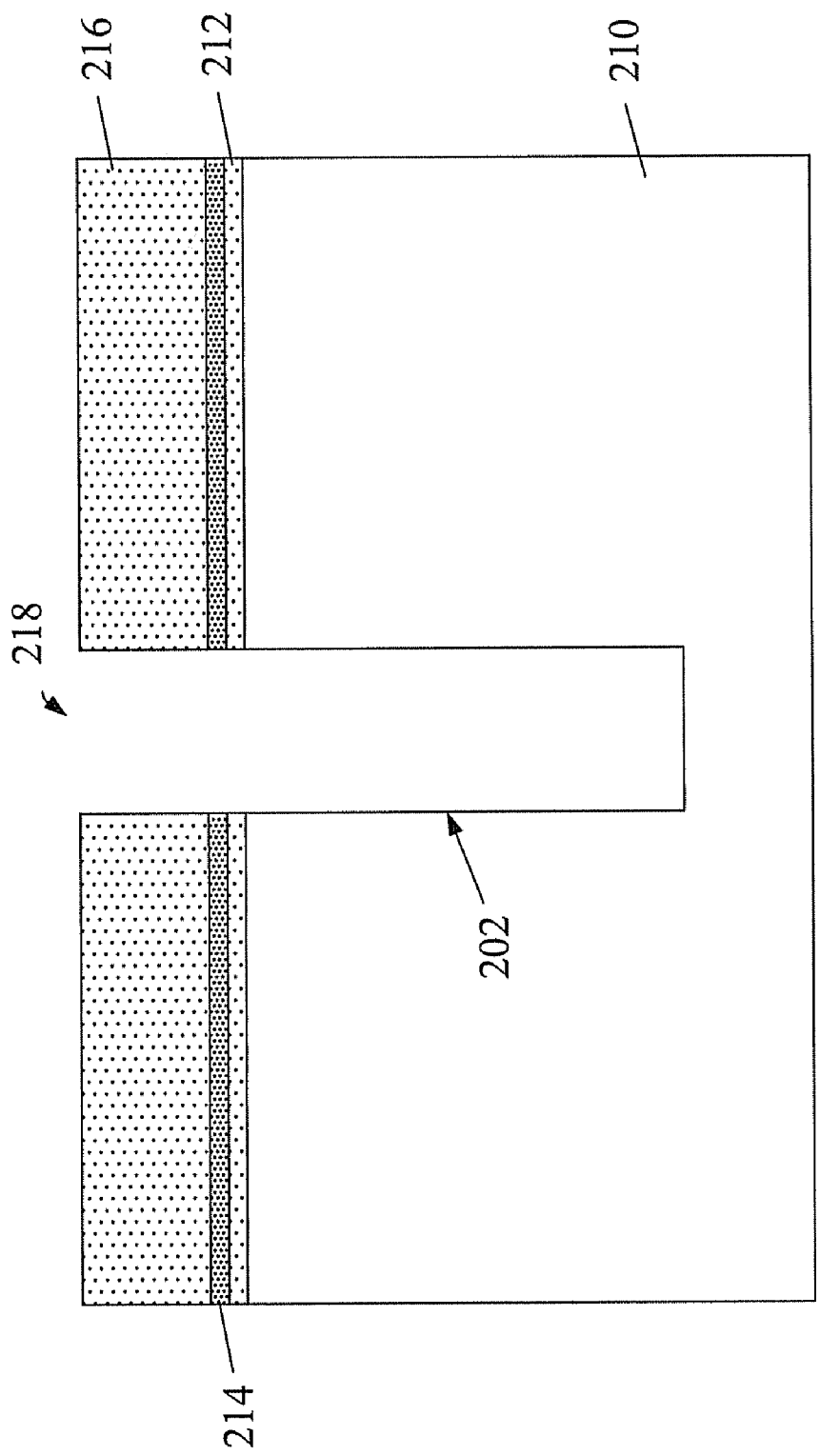
FIGS. 4(a) through 4(k) are a series of cross sectional views illustrating an exemplary process flow in forming the structure depicted in FIG. 3.

Beginning with FIG. 4(a), a p-type bulk silicon substrate 210 includes a standard pad oxide ($SiO_2$) layer 212 thermally grown thereon to an exemplary thickness ranging from about 2 nanometers (nm) to about 20 nm. Then, a pad nitride ($Si_3N_4$) layer 214 and an oxide ($SiO_2$) hard mask 216 are deposited, such as by chemical vapor deposition (CVD). The thickness of the pad nitride layer 214 is preferably between about 10 nm to about 50 nm, with the overlying oxide hard mask 216 thickness between about 50 nm to about 500 nm. The thickness of the oxide hard mask 216 is substantially greater than the other layers, since it is subsequently used as a hard mask for the etching of the deep trenches. Openings 218 for the deep trench capacitors are patterned in the oxide hard mask 216 using standard lithography in a photoresist layer (not shown). After etching the openings in the oxide hard mask 216, the photoresist is stripped. Standard RIE (Reactive Ion Etching) is then used to form the deep trenches 202 within the bulk substrate 210. The oxide hard mask 216 (still shown in FIG. 4(a)) is then stripped following the deep trench etch.

Figure 4B:
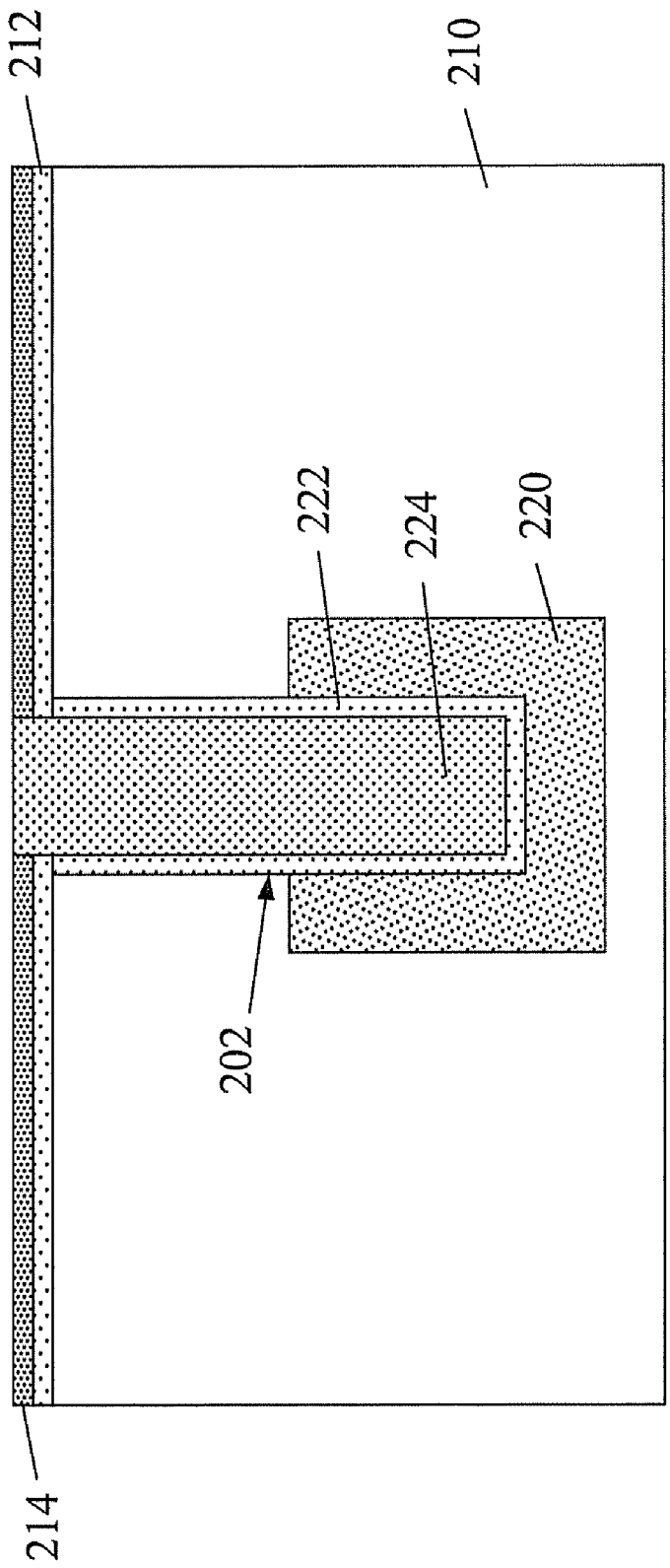

As then shown in FIG. 4(b), a buried plate N+ outdiffusion region 220 is formed about the lower portion of the deep trench 202. The outdiffusion region formation includes depositing a layer of arsenic (As) doped glass (ASG) (not shown), recessing the ASG film to remove the ASG material from the upper portion of the deep trench 202, and thereafter outwardly driving the arsenic atoms into the surrounding substrate 210 with a thermal anneal. Following the anneal, the remaining ASG material is stripped. With the outdiffusion region 220 serving as a buried plate electrode for a deep trench capacitor, a capacitor dielectric layer 222 is then created by forming a sidewall oxide layer through either chemical or thermal means, followed by a CVD nitride layer and then a subsequent thermal oxidation so as to define an ONO (oxide-nitride -oxide) capacitor dielectric. As further shown in FIG. 4(b), an N+ polysilicon material 224 is then deposited into the deep trench, over the capacitor dielectric layer 222, and thereafter planarized. A portion of the polysilicon material 224 will serve as a second capacitor electrode.

Figure 4C:
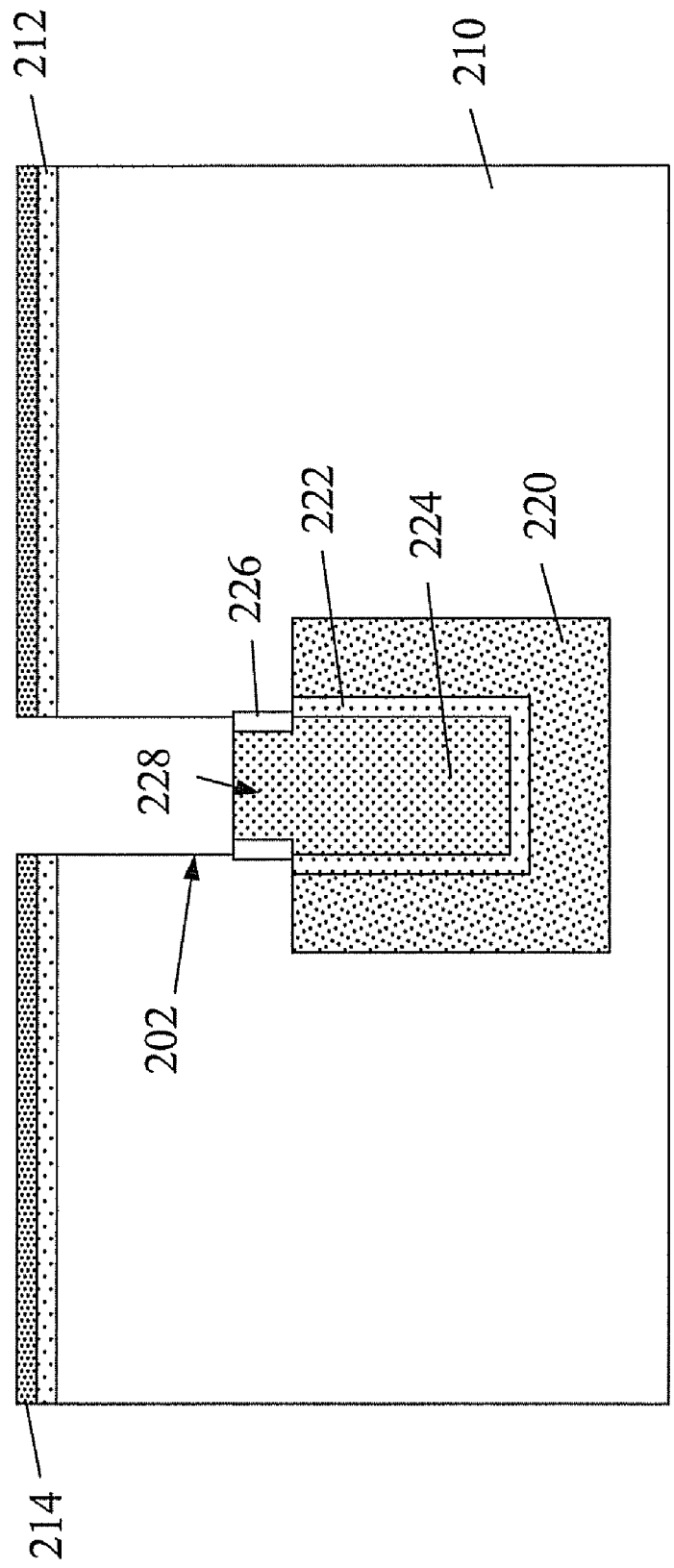

Proceeding to FIG. 4(c), the exposed portions of the polysilicon material 224 and the capacitor dielectric layer 222 are recessed to a depth of about 0.5 microns ($\mu m$) to about 2.5 $\mu m$ from the top surface of the semiconductor substrate 210. An oxide isolation collar 226 is formed, such as by conformal deposition of CVD oxide followed by RIE of the deposited oxide. The width of the oxide isolation collar 226 ranges from about 10 nm to about 40 nm. Other known methods for the formation of the oxide isolation collar 226 are also contemplated, however. Then, additional N+ polysilicon is deposited, filling the remainder of the trench, thereafter planarized by chemical mechanical polishing (CMP) and recessed. The recess depth for the additional polysilicon fill is selected such that the top surface of the additional N+ polysilicon fill 228 is about 0.2 $\mu m$ to about 1.0 $\mu m$ above the bottom of the oxide isolation collar 226. Then, the exposed portion of the collar 226 and underlying capacitor dielectric layer 222 are removed with a wet or dry isotropic etch to result in the intermediate structure of FIG. 4(c).

Figure 4D:
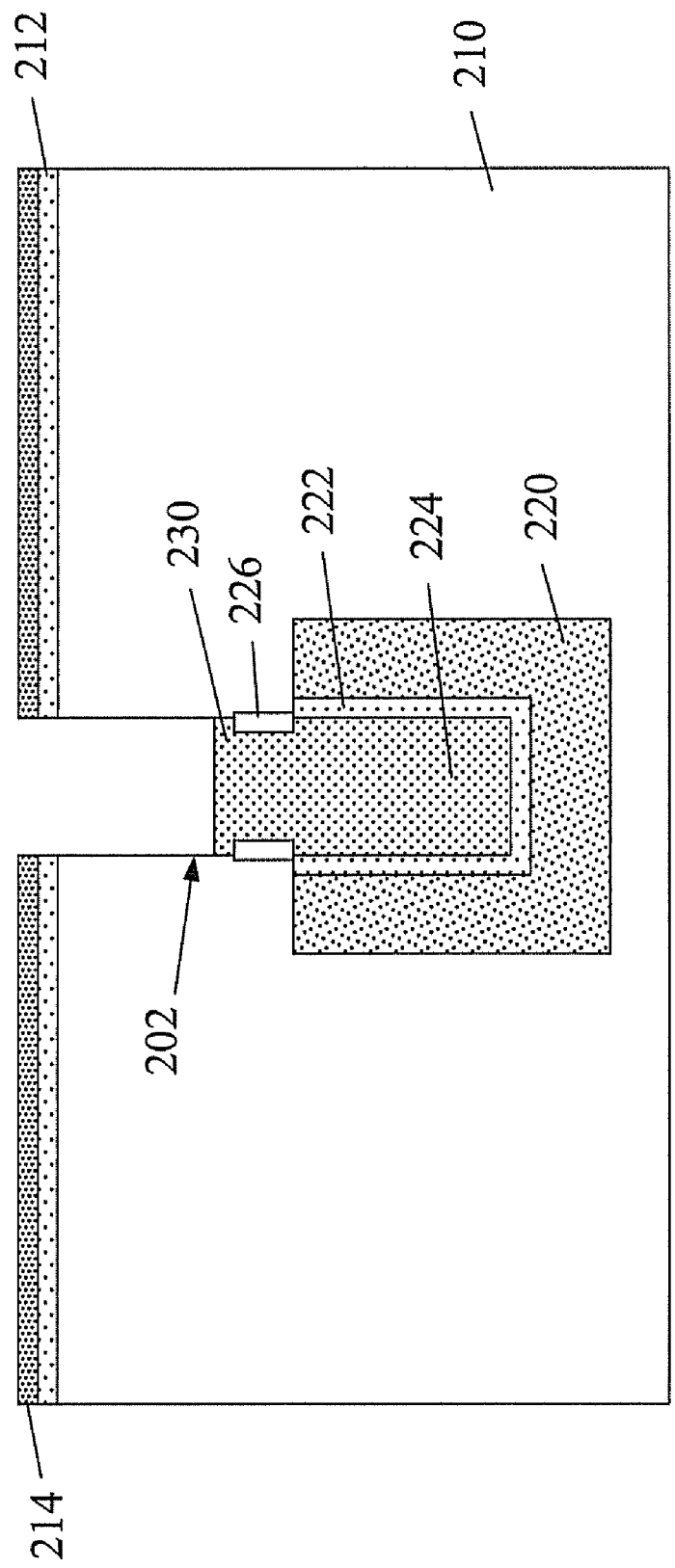

Referring now to FIG. 4(d), a polysilicon buried strap 230 is formed in order to provide a connection between the deep trench capacitor and the lower source-drain diffusion of the vertical MOSFET. The formation of the buried strap 230 once again entails filling the upper portion of the deep trench with N+ polysilicon material, planarizing, and thereafter recessing the polysilicon to a depth that is about 5 nm to about 30 nm above the top edge of the oxide isolation collar 226.

Figure 4E:
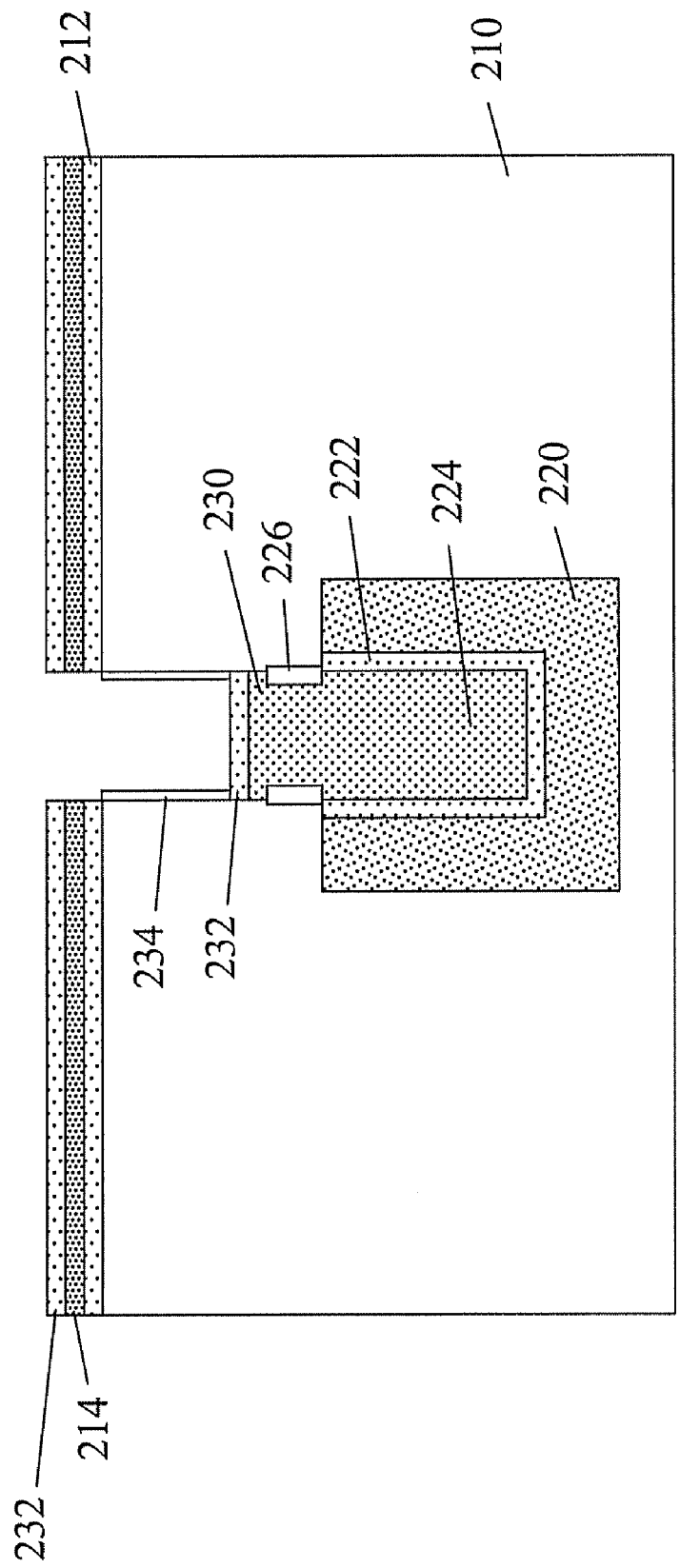

As then shown in FIG. 4(e), a trench top oxide (TTO) and gate dielectric of the vertical MOSFET are formed. The TTO is formed by deposition of a high density plasma (HDP) silicon dioxide layer 232, which forms substantially on the horizontal surfaces but negligibly on the vertical sidewalls. Any residual deposited oxide is removed from the vertical surfaces (trench sidewalls) by a short isotropic etch, which does not significantly alter the thickness of the oxide 232 on the horizontal surfaces. It will also be noted that the HDP oxide layer 232 is also deposited on the surface of the pad nitride 214. This portion of the layer of HDP oxide 232 is removed later in the process. The purpose of the TTO 232 formed on the buried strap 230 is to isolate the capacitor N+ polysilicon node conductor from the subsequently formed gate conductor of the vertical MOSFET.

Figure 4F:
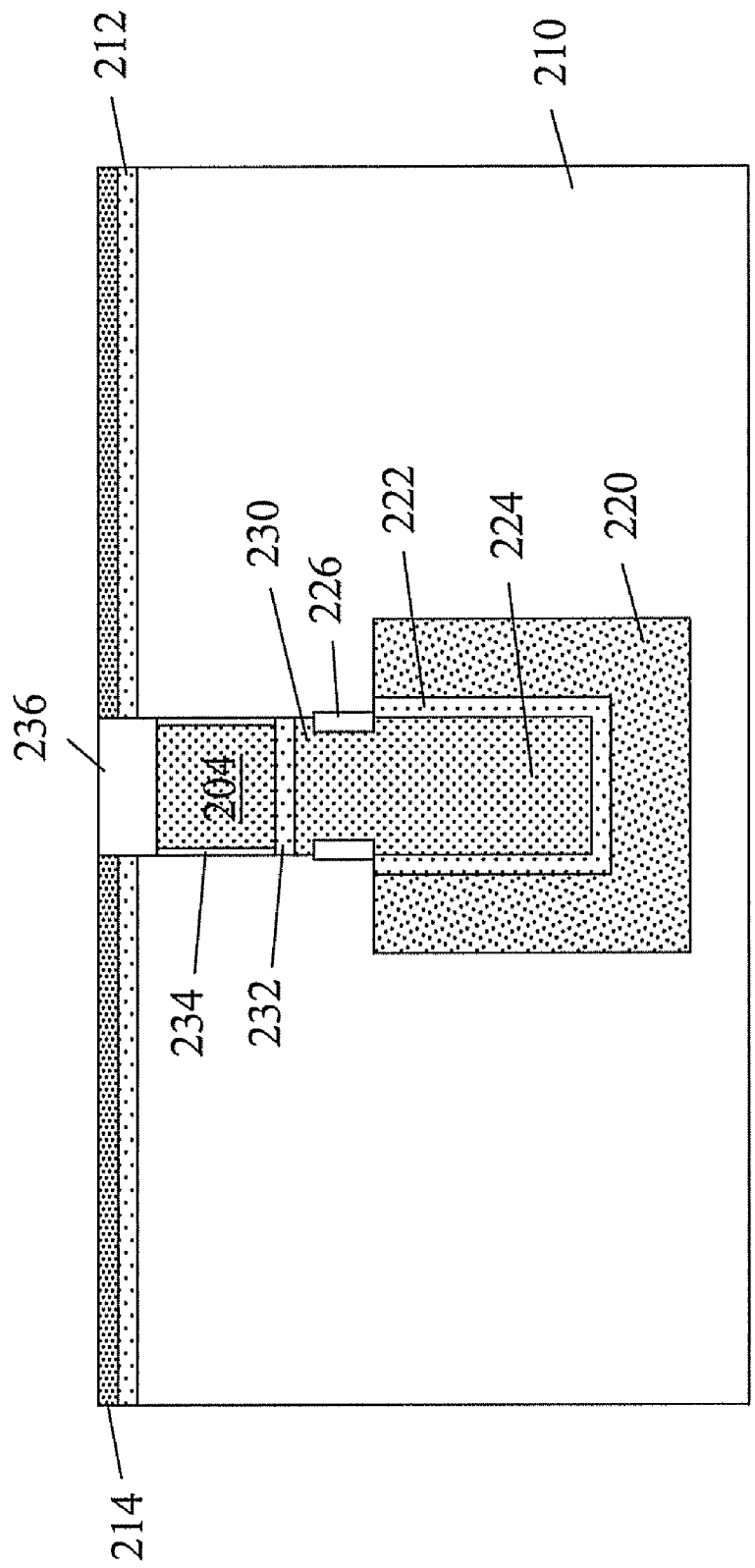

Following removal of the HDP oxide from the sidewalls of the deep trench, a gate dielectric 234 for the vertical MOSFET is formed. The gate dielectric 234 may include, for example, silicon dioxide, silicon oxynitride, high-K materials or combinations thereof. The gate dielectric may be formed by reaction of an oxygen and/or nitrogen containing species with the silicon of the trench sidewall, or may be formed by chemical vapor deposition (CVD). Then, as shown in FIG. 4(f), N+ polysilicon is once again deposited, filling the open portion of the deep trench above the TTO 232. The N+ polysilicon and the portion of the HDP oxide 232 that was deposited on the surface of the pad nitride layer 214 in the previous step are then planarized by CMP, stopping on the pad nitride 214. The N+ polysilicon is then recessed beneath the top surface of the silicon substrate 210 by about 5 nm to about 30 nm. This remaining portion of the N+ polysilicon material formed atop the TTO 232 serves as the gate conductor 204 of the vertical MOSFET, as described previously. Upon completion of the gate conductor definition, a gate top oxide (GTO) 236 is deposited over the gate conductor 204 and planarized to the surface of the pad nitride 214.

Figure 4G:
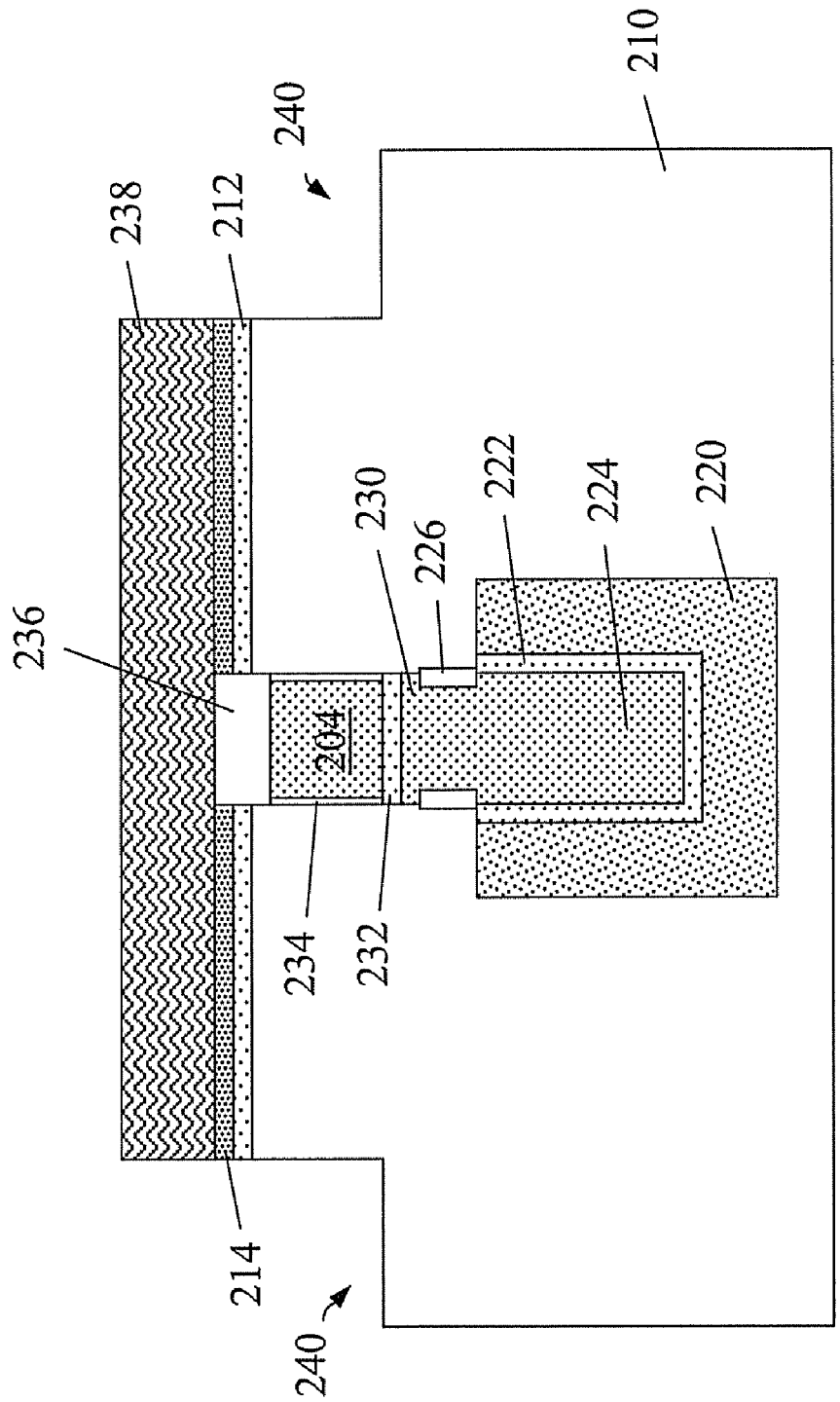
Figure 4H:
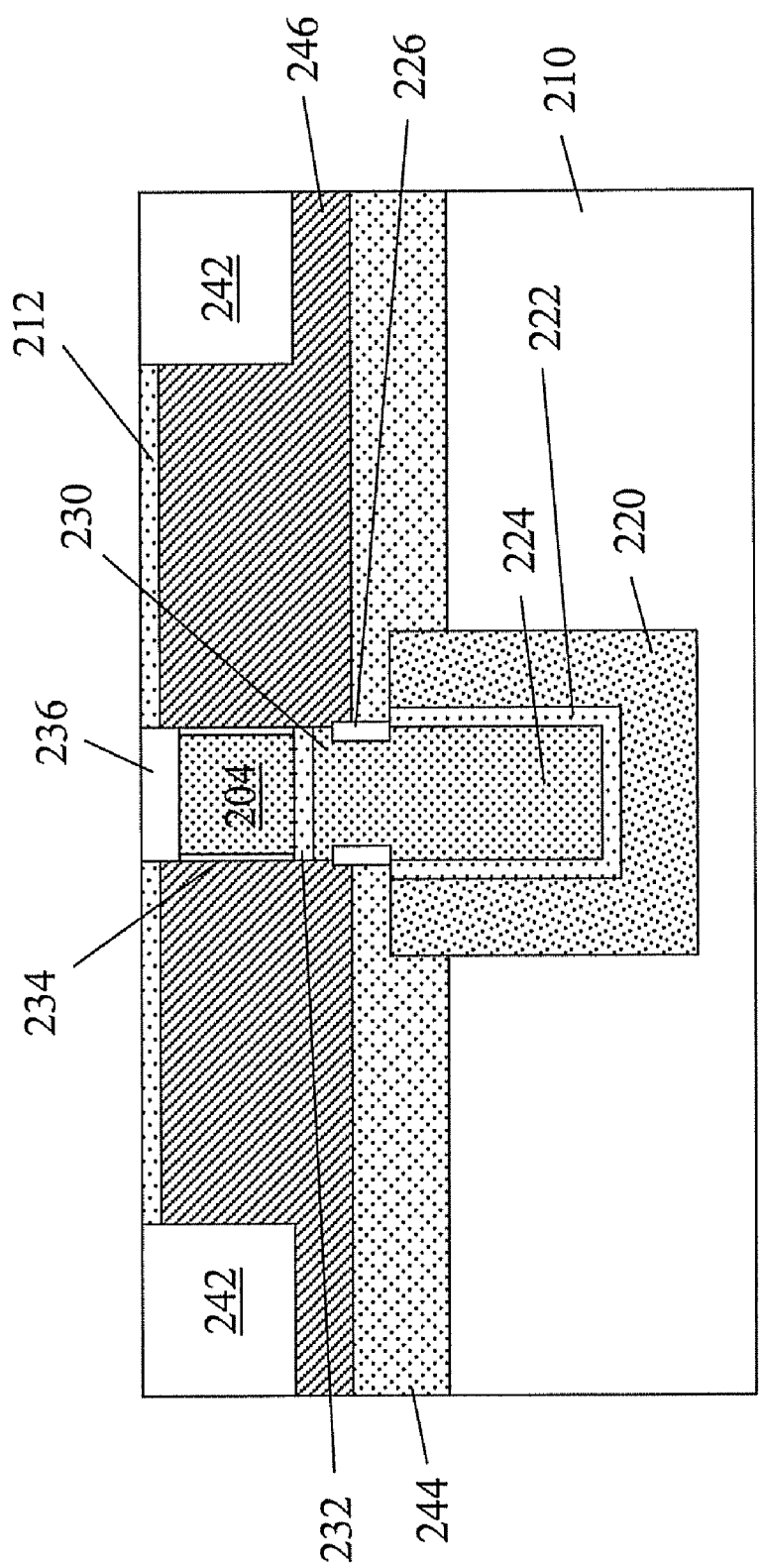

As shown in FIG. 4(g), a layer of photoresist 238 is applied to the device surface and patterned in accordance with standard lithography techniques, followed by formation of shallow trenches 240 (e.g., about 50 nm to about 500 nm) by reactive ion etching into the substrate 210. The shallow trenches 240 will subsequently provide device isolation as is known in the art. The photoresist layer 238 is then stripped, followed by deposition and planarization of a CVD oxide so as to form shallow trench isolation (STI) regions 242 as shown in FIG. 4(h). The pad nitride layer 214 is then stripped. As further shown in FIG. 4(g), an N-band region 244 is formed in the substrate 210 by a high-energy implantation of an n-type dopant (such as phosphorus or arsenic, for example). The N-band 244 serves to isolate a subsequently formed P-well from the bulk substrate 210 and to distribute the voltage bias to the N+ buried plate 220 of the capacitors. N-well implants (e.g., phosphorus, arsenic) are performed with a blocking mask (not shown) in place to cover up the P-well areas and define the doping profile for the PFETs. As also shown in FIG. 4(h), P-well regions 246 are formed by implantation of a suitable p-type dopant (e.g., boron) with a blocking mask covering the N-well areas.

Figure 4I:
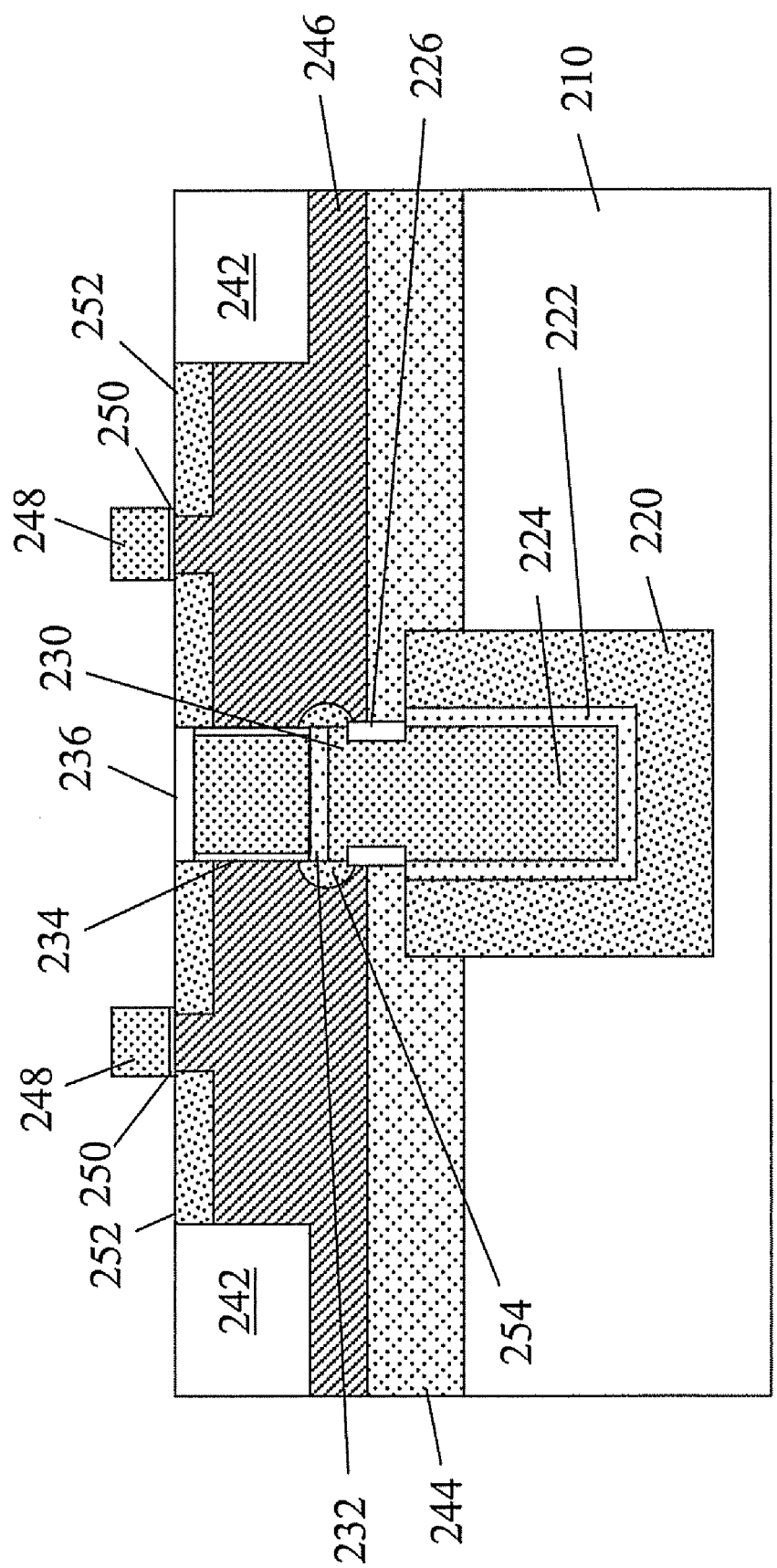

Proceeding to FIG. 4(i), the pad oxide layer 212 is stripped, followed by formation of planar transistor gate structures. This includes formation of a gate dielectric material including silicon dioxide, oxynitride, aluminum oxide, high-K dielectric, or suitable combinations thereof. A stack of gate conductor material (e.g., polysilicon) is then deposited. Although a polysilicon gate conductor is shown in this exemplary embodiment, other conductive materials such as silicides and metals and combinations thereof are also contemplated. Standard lithography and etching is used to pattern the gate conductor stack and gate dielectric material to form the resulting gate conductors 248 and underlying gate dielectric layers 250 shown in FIG. 4(*i*).

In addition, a blocking mask (not shown) is applied followed by an N+ implantation (e.g., As) to form N+ diffusions 252 for the source and drain junctions of the NFETs and n-well contact diffusions. The N+ implant also dopes the N+ polysilicon gate conductors 248. Additional N+ extension and halo implantations are also performed for the planar transistors as known in the art, but not specifically illustrated in FIG. 4(*i*). The N+ block mask is then stripped. Another blocking mask is applied and a P+ implantation (e.g., boron) is used to form P+ diffusions for source and drain junctions of the PFETs and the p-well contact diffusion (not shown in the cross sectional view of FIG. 4(*i*)). The P+ implant also dopes the P+ polysilicon gate conductors. Again, additional P+ extension and halo implantations are also performed but not shown herein.

Both the N+ and P+ diffusions and the doped polysilicon regions are activated with an anneal. This anneal may be, for example a rapid thermal anneal (RTA) or a laser spike anneal (LSA) to minimize diffusion of the dopants and preserve shallow junctions and steep channel doping profiles. The anneal also drives out N+ dopant from the buried strap 230 in the upper portion of the trench capacitors, defining the lower source/drain diffusions 254 of the vertical access transistors. It will be noted that the buried strap anneal may be performed before source/drain and extension implantations so as to optimize the buried strap and source/drain formation. As a result, the buried strap 230 now provides a conductive bridge between the capacitor node 224 and the lower source/drain diffusion 254 of the vertical access transistor. It should further be appreciated at this point that in the course of forming the source/drain diffusions, extensions and halos, various spacers (not shown for clarity) are formed on the sidewalls of the gate conductors, as is known in the art.

Referring now to FIG. 4(*j*), a first level of metallization is implemented, beginning with the deposition of a first interlayer or interlevel dielectric (ILD) 256, such as by CVD. Then, vias 258 are etched to provide openings to the diffusions and vertical MOSFET gate, as well as to the planar MOSFET gates (not shown). In accordance with damascene or dual damascene processing, first level troughs (such as those use to form wiring such as the capacitance switch line 108) are also formed in the first ILD layer 256. Further, in accordance with known metallization techniques, the contact metallurgy (e.g. tungsten, copper) and associated liner materials are deposited and planarized by CMP.

Finally, as shown in FIG. 4(*k*), a second ILD layer 260 is formed, followed by etching of second level vias 262 and trenches corresponding to the second level metal conductors (e.g., word lines, bit lines, power rail conductors, etc.). Metal fill of the etched vias and troughs is again carried out in accordance with known damascene techniques. Wiring 264 in the second metal level connects adjacent NFETs on opposing sides of the deep trench capacitor and the capacitance switch line 108. Thus configured, the structure of FIG. 4(*k*) provides an SEU hardened structure with a switchably added internal node capacitance in a manner that avoids sacrificing performance, and that saves area by the use of a deep trench capacitor/vertical access transistor combination.

Figure 5:
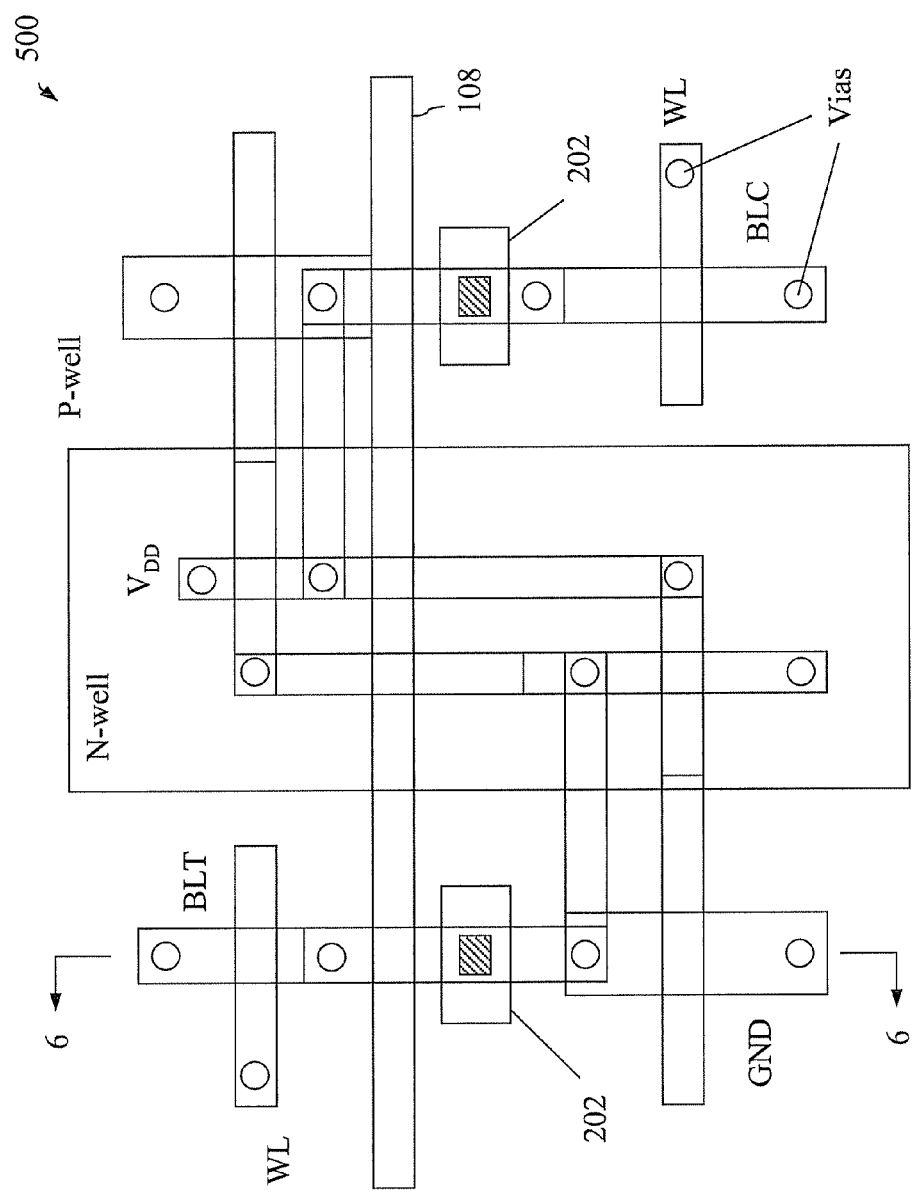
FIG. 5 is a layout view of another exemplary structural implementation of the SRAM cell of FIG. 1, wherein the switching transistors coupled to the node capacitors are planar transistors.
Figure 6:
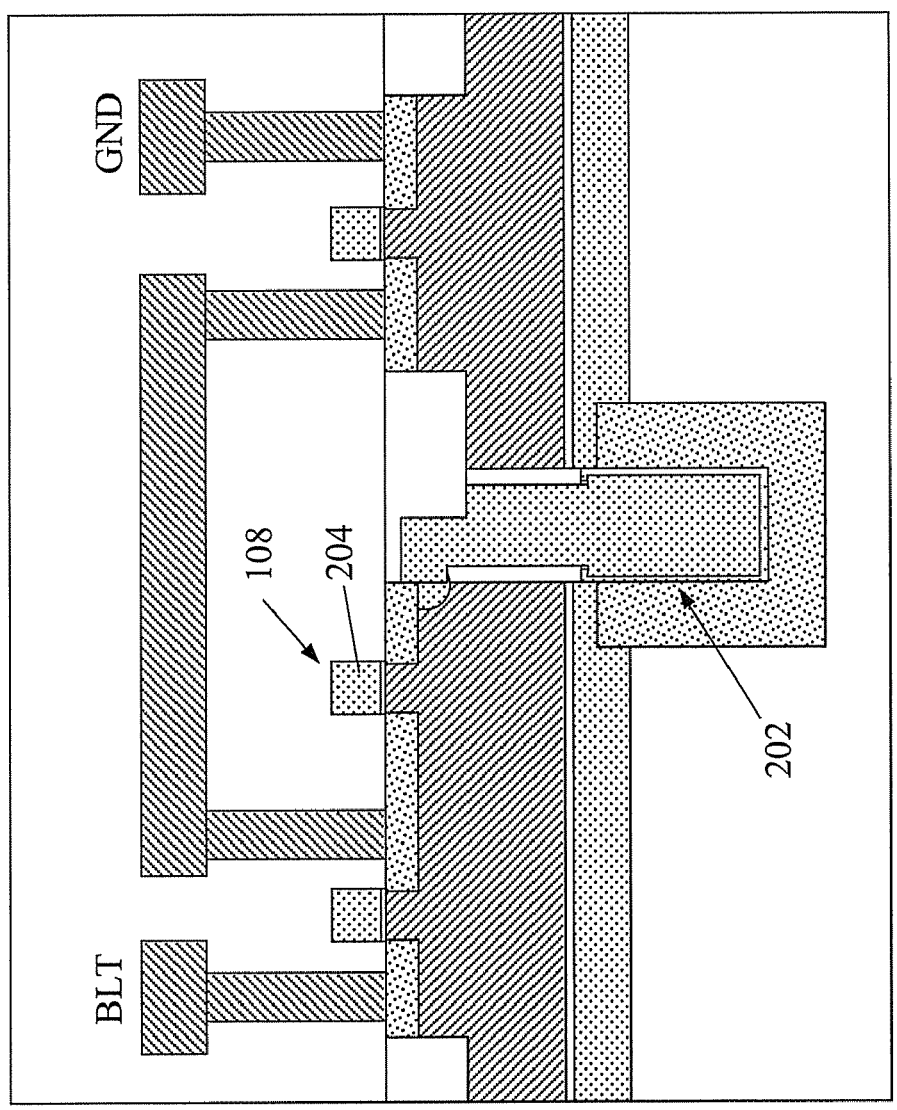
FIG. 6 is a cross sectional view of the SRAM cell of FIG. 5, taken along the lines 6-6 of FIG. 5.

In the exemplary embodiment described to this point, vertical access transistors are used in conjunction with the deep trench capacitors. However, for a simpler manufacturing process flow where a slight increase in device real estate is tolerable, the access transistors may alternatively be planar transistors, as is the case for the remaining cell transistors. To this end, FIGS. 5 and 6 illustrate an alternative exemplary structural implementation of the SRAM cell of FIG. 1, wherein the switching transistors coupled to the node capacitors are planar transistors. In particular, FIG. 5 is a layout view of such a cell 500, while FIG. 6 is a cross sectional view of the cell 500 taken along the lines 6-6 in FIG. 5.

In contrast to the embodiments of FIGS. 2-4, the capacitance switch line 108 is disposed adjacent the deep trenches 202 in which the capacitors C1, C2 reside, instead of directly above. This is due to the fact that since the gate conductor 204 of the associated switching transistors (e.g., N4, N5) is not formed within the deep trenches 202, but instead above the substrate as is the case with the other transistor gates. As such, a separate metal conductor is not needed to connect to the gate conductor 204 in order to serve as the capacitance switch line 108. Stated another way, the gate conductor 204 also serves as the capacitance switch line 108 in this embodiment. The remaining device structures illustrated in FIG. 6 are discussed in further detail hereinafter in conjunction with an exemplary process flow for forming the same.

FIGS. 7(*a*) through 7(*f*) are a series of cross sectional views illustrating an exemplary process flow in forming the structure depicted in FIG. 6. Again, although the exemplary process for forming the cell structure follows a standard process for eDRAM technology in bulk CMOS, such process steps are also applicable to other substrates (e.g., silicon on insulator (SOI), hybrid oriented substrates, heterojunction substrates, etc.) as well. With respect to the embodiment of FIGS. 4(*a*) through 4(*k*) corresponding structures are designated with the same reference number for ease of description.

Beginning with FIG. 7(*a*), a p-type bulk silicon substrate 210 includes a standard pad oxide ($SiO_2$) layer 212 thermally grown thereon to an exemplary thickness ranging from about 2 nanometers (nm) to about 20 nm. Then, a pad nitride ($Si_3N_4$) layer 214 and an oxide ($SiO_2$) hard mask 216 are deposited, such as by chemical vapor deposition (CVD). The thickness of the pad nitride layer 214 is preferably between about 10 nm to about 50 nm, with the overlying oxide hard mask 216 thickness between about 50 nm to about 500 nm. The thickness of the oxide hard mask 216 is substantially greater than the other layers, since it is subsequently used as a hard mask for the etching of the deep trenches. Openings 218 for the deep trench capacitors are patterned in the oxide hard mask using standard lithography in a photoresist layer (not shown). After etching the openings in the hard mask 216, the photoresist is stripped. Standard RIE is then used to form the deep trenches 202 within the bulk substrate 210. The oxide hard mask 216 (still shown in FIG. 7(*a*)) is then stripped following the deep trench etch.

As then shown in FIG. 7(*b*), a buried plate N+ outdiffusion region 220 is formed about the lower portion of the deep trench 202. The outdiffusion region formation includes depositing a layer of ASG (not shown), recessing the ASG film to remove the ASG material from the upper portion of the deep trench 202, and thereafter outwardly driving the arsenic atoms into the surrounding substrate 210 with a thermal anneal. Following the anneal, the remaining ASG material is stripped. With the outdiffusion region 220 serving as a buried plate electrode for a deep trench capacitor, a capacitor dielectric layer 222 is then created by forming a sidewall oxide layer through either chemical or thermal means, followed by a CVD nitride layer and then a subsequent thermal oxidation so as to define an ONO (oxide-nitride-oxide) capacitor dielectric. As further shown in FIG. 7(*b*), an N+ polysilicon material 224 is then deposited into the deep trench, over the capacitor dielectric layer 222, and thereafter planarized. A portion of the polysilicon material 224 will serve as a second capacitor electrode.

The exposed portions of the polysilicon material 224 and the capacitor dielectric layer 222 are recessed to a depth of about 0.25 μm to about 2.0 μm from the top surface of the semiconductor substrate 210. An oxide isolation collar 702 is formed on the trench sidewalls, such as by conformal deposition of CVD oxide followed by RIE of the deposited oxide. Other known methods for the formation of the oxide isolation collar 702 are also contemplated, however. The upper portion of the deep trench is then refilled with N+ polysilicon 704, wherein prior thereto, the oxide collar 702 is recessed to a sufficient depth such that the topmost portion 706 of the N+ polysilicon is in direct contact with the trench sidewall. After the N+ polysilicon 706 is planarized to the nitride surface 214, additional polysilicon 704 is recessed to a depth from about 10 nm to about 50 nm below the surface of the substrate, leaving a portion 712 of the polysilicon contacting the silicon substrate 210 to serve as the strap. Such processing steps (e.g., polysilicon deposition and recess, collar oxide deposition and RIE, dielectric removal from the upper portion of the deep trench, additional polysilicon deposition and CMP, etc.) are well known within the art of DRAM trench technology.

Figure 7A:
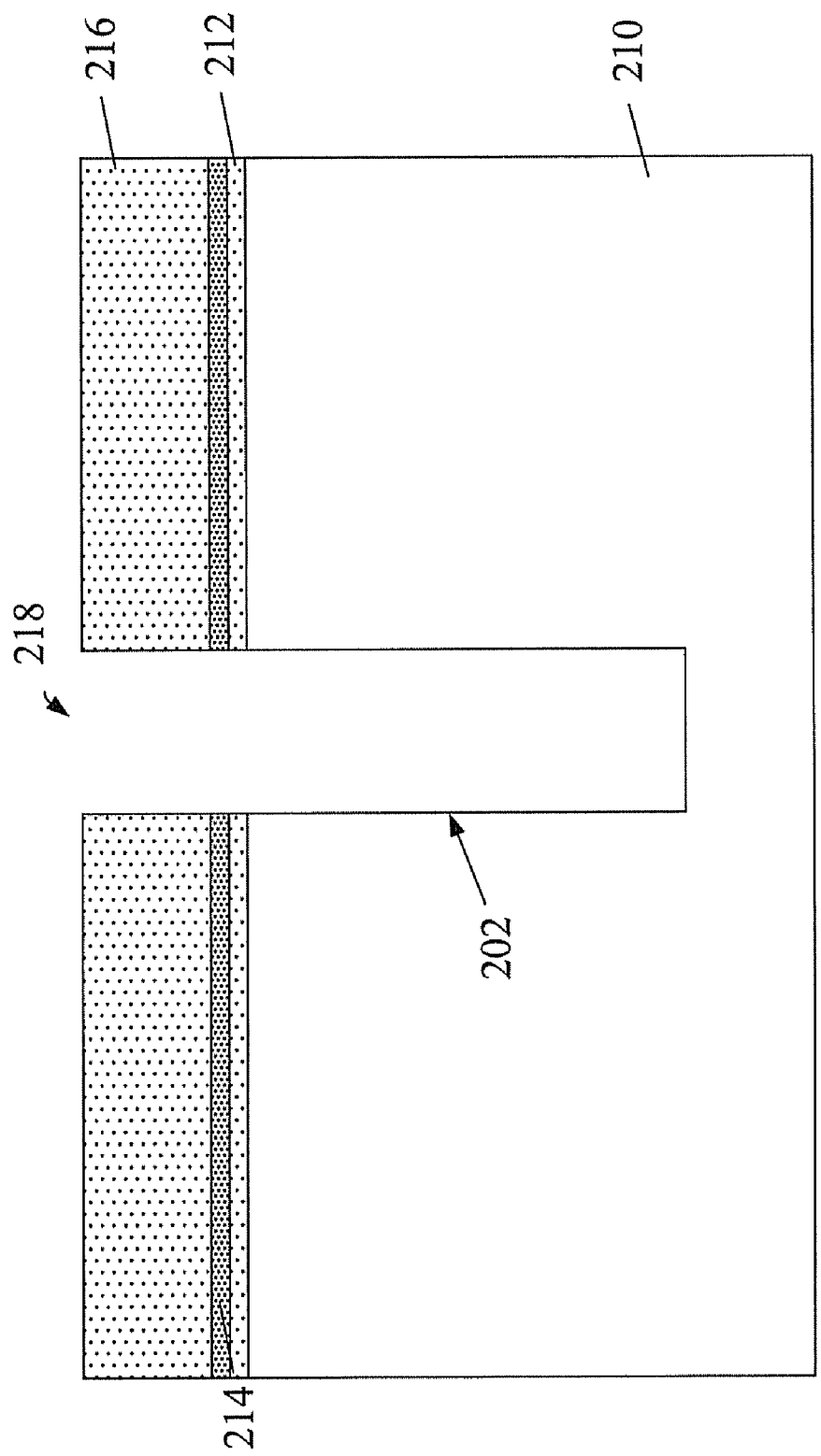
FIGS. 7(a) through 7(f) are a series of cross sectional views illustrating an exemplary process flow in forming the structure depicted in FIG. 6.
Figure 7B:
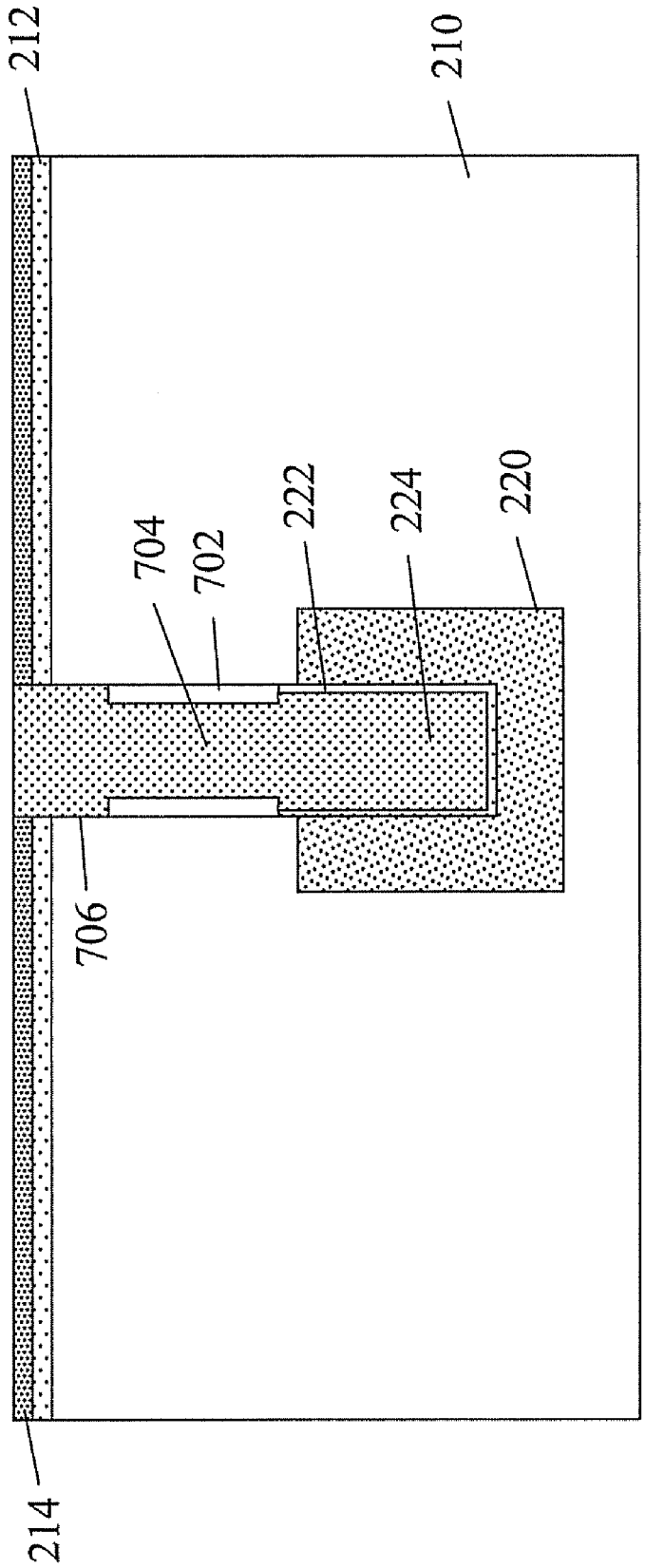
Figure 7C:
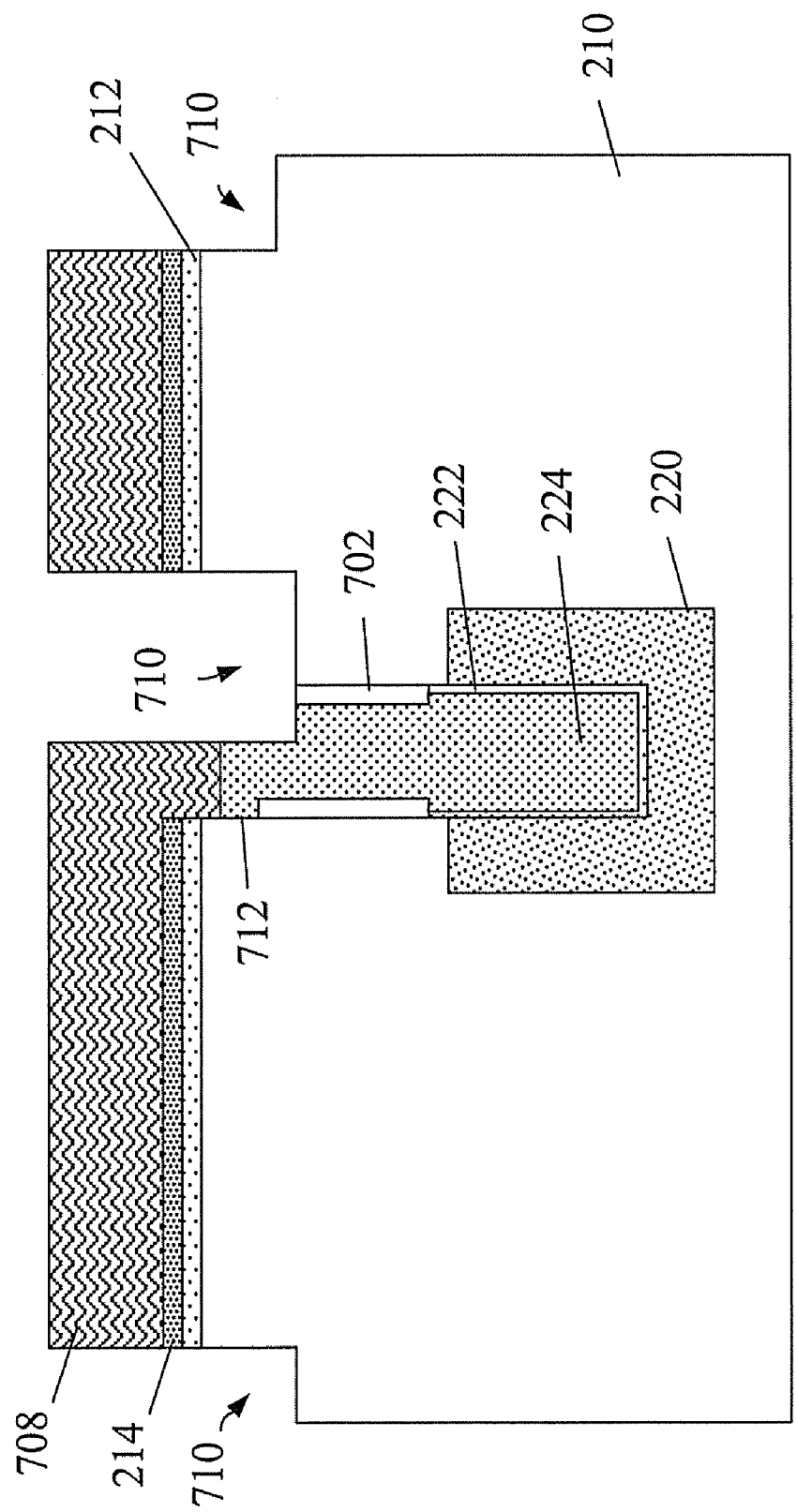
Figure 7D:
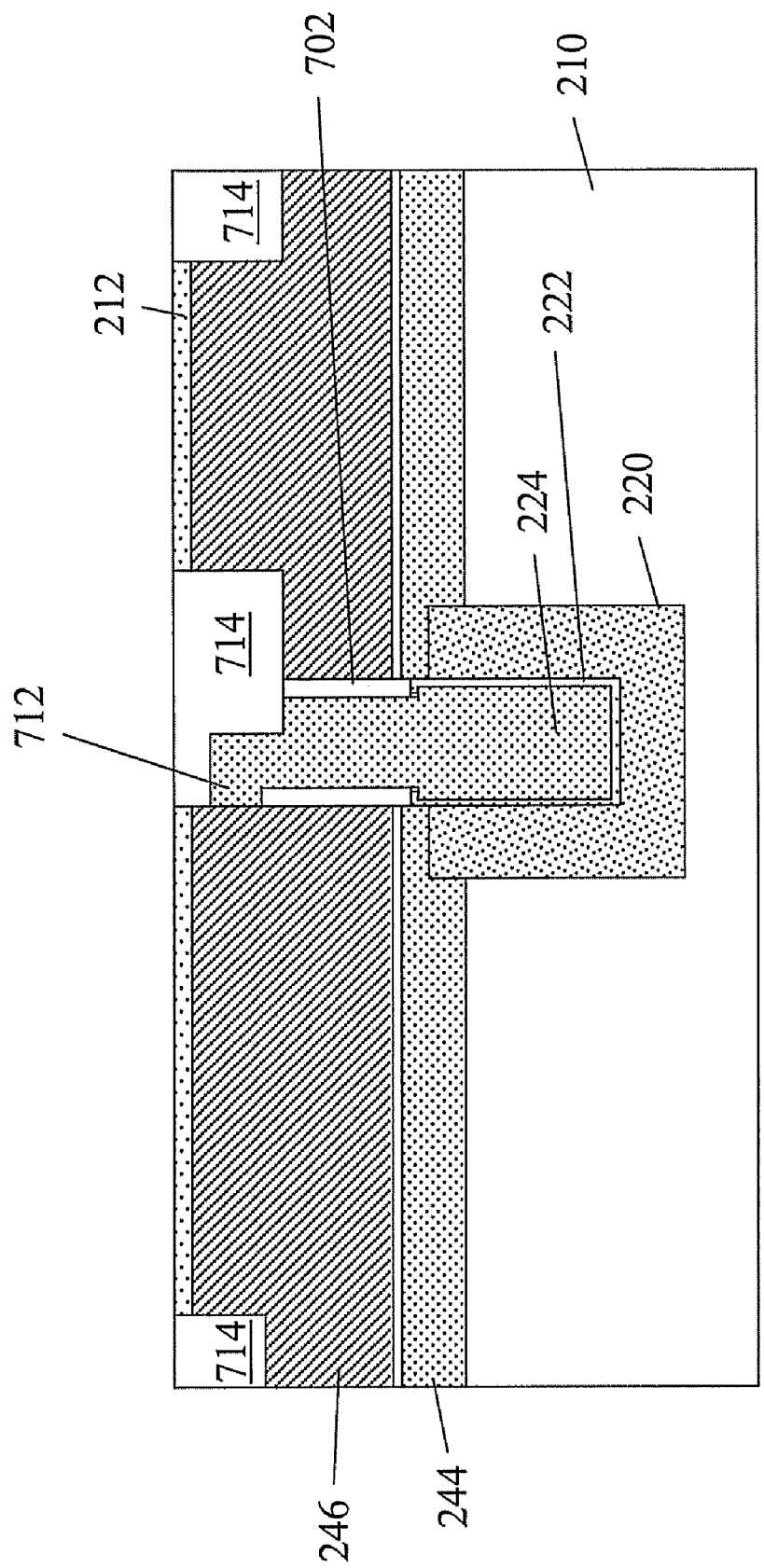

As then further shown in FIG. 7(c), lithographic processing is used to pattern openings in a photoresist layer 708 for the subsequent etching of shallow trenches 710. In FIG. 7(d), the shallow trenches 710 and deep trench top recesses are filed with CVD oxide (e.g., TEOS or HDP oxide) and thereafter planarized by CMP to the top surface of the pad nitride layer 214, resulting in STI regions 714. The pad nitride layer 214 is then stripped.

As further shown in FIG. 7(d), an N-band region 244 is formed in the substrate 210 by a high-energy implantation of an n-type dopant (such as phosphorus or arsenic, for example). The N-band 244 serves to isolate a subsequently formed P-well from the bulk substrate 210 and to distribute the voltage bias to the N+ buried plate 220 of the capacitors. N-well implants (e.g., phosphorus, arsenic) are performed with a blocking mask (not shown) in place to cover up the P-well areas and define the doping profile for the PFETs. As also shown in FIG. 7(d), P-well regions 246 are formed by implantation of a suitable p-type dopant (e.g., boron) with a blocking mask covering the N-well areas.

Figure 7E:
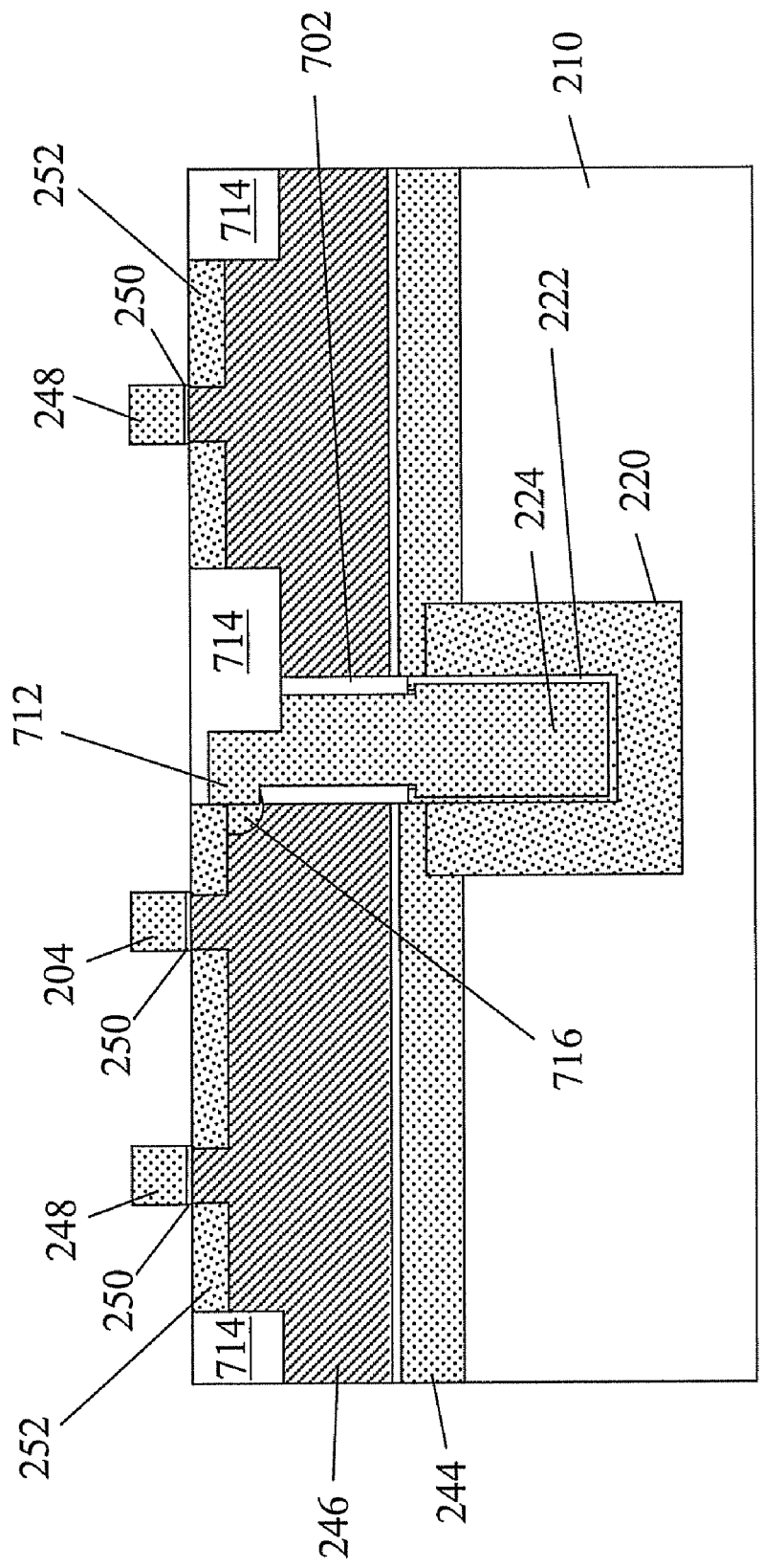

Referring to FIG. 7(e), the pad oxide layer 212 is stripped, followed by formation of planar transistor gate structures. This includes formation of a gate dielectric material including silicon dioxide, oxynitride, aluminum oxide, high-K dielectric, or suitable combinations thereof. A stack of gate conductor material (e.g., polysilicon) is then deposited. Although a polysilicon gate conductor is shown in this exemplary embodiment, other conductive materials such as silicides and metals and combinations thereof are also contemplated. Standard lithography and etching is used to pattern the gate conductor stack and gate dielectric material to form the resulting gate conductors 204, 248 and underlying gate dielectric layers 250. In comparison with the embodiment of FIG. 4, gate conductor 204 of the access transistor is also a planar gate structure.

In addition, a blocking mask (not shown) is applied followed by an N+ implantation (e.g., As) to form N+ diffusions 252 for the source and drain junctions of the NFETs and n-well contact diffusions. The N+ implant also dopes the N+ polysilicon gate conductors 248. Additional N+ extension and halo implantations are also performed for the planar transistors as known in the art, but not specifically illustrated in FIG. 4(i). The N+ block mask is then stripped. Another blocking mask is applied and a P+ implantation (e.g., boron) is used to form P+ diffusions for source and drain junctions of the PFETs and the p-well contact diffusion (not shown in the cross sectional view of FIG. 7(e)). The P+ implant also dopes the P+ polysilicon gate conductors. Again, additional P+ extension and halo implantations are also performed but not shown herein.

Both the N+ and P+ diffusions and the doped polysilicon regions are activated with an anneal. This anneal may be, for example a rapid thermal anneal (RTA) or a laser spike anneal (LSA) to minimize diffusion of the dopants and preserve shallow junctions and steep channel doping profiles. The anneal also drives out N+ dopant from the strap 712 in the upper portion of the trench capacitors, so as to form a conductive bridge 716 between the strap 712 and the adjacent source/drain diffusion of the access transistor. It should further be appreciated at this point that in the course of forming the source/drain diffusions, extensions and halos, various spacers (not shown for clarity) are formed on the sidewalls of the gate conductors, as is known in the art.

Figure 4J:
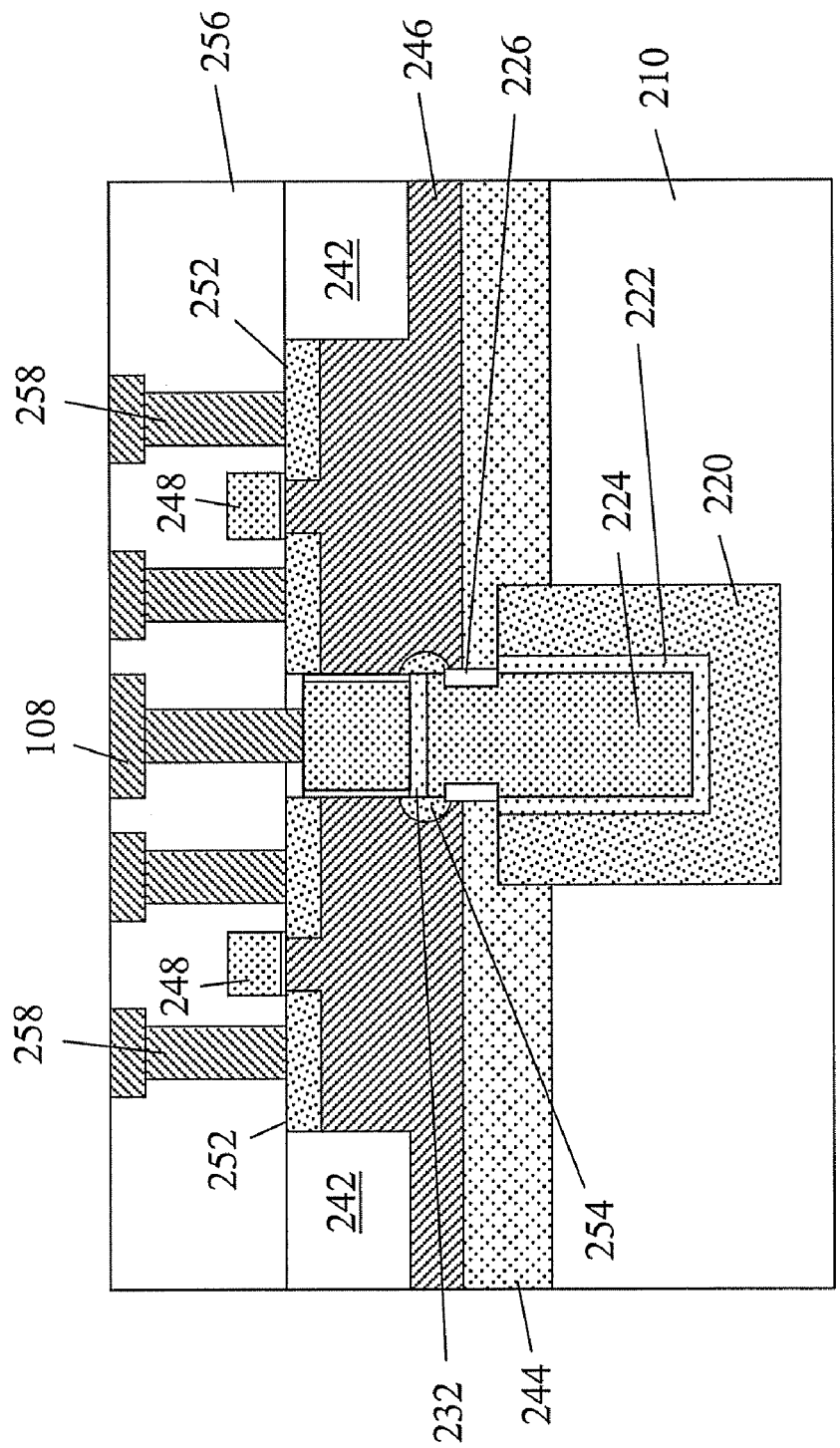
Figure 4K:
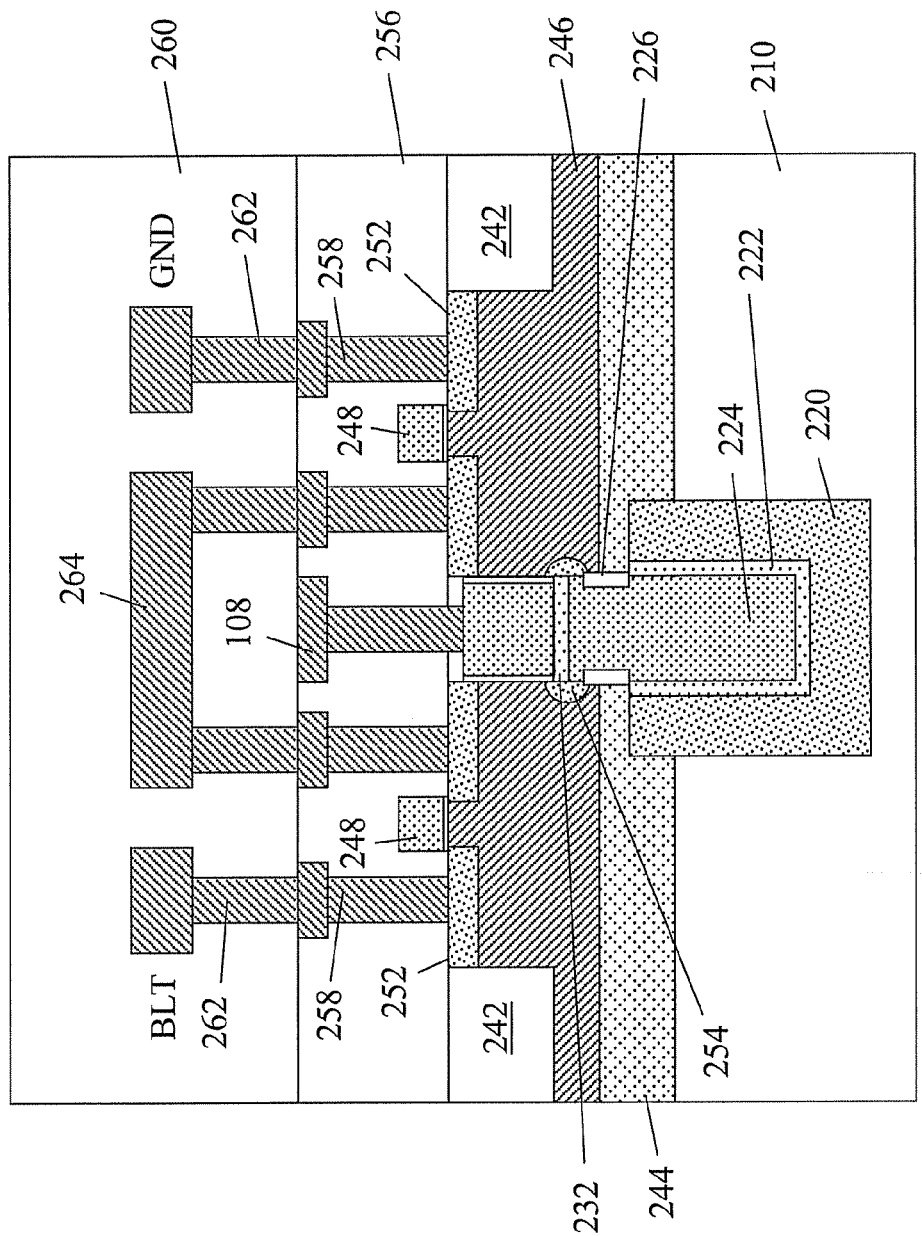
Figure 7F:
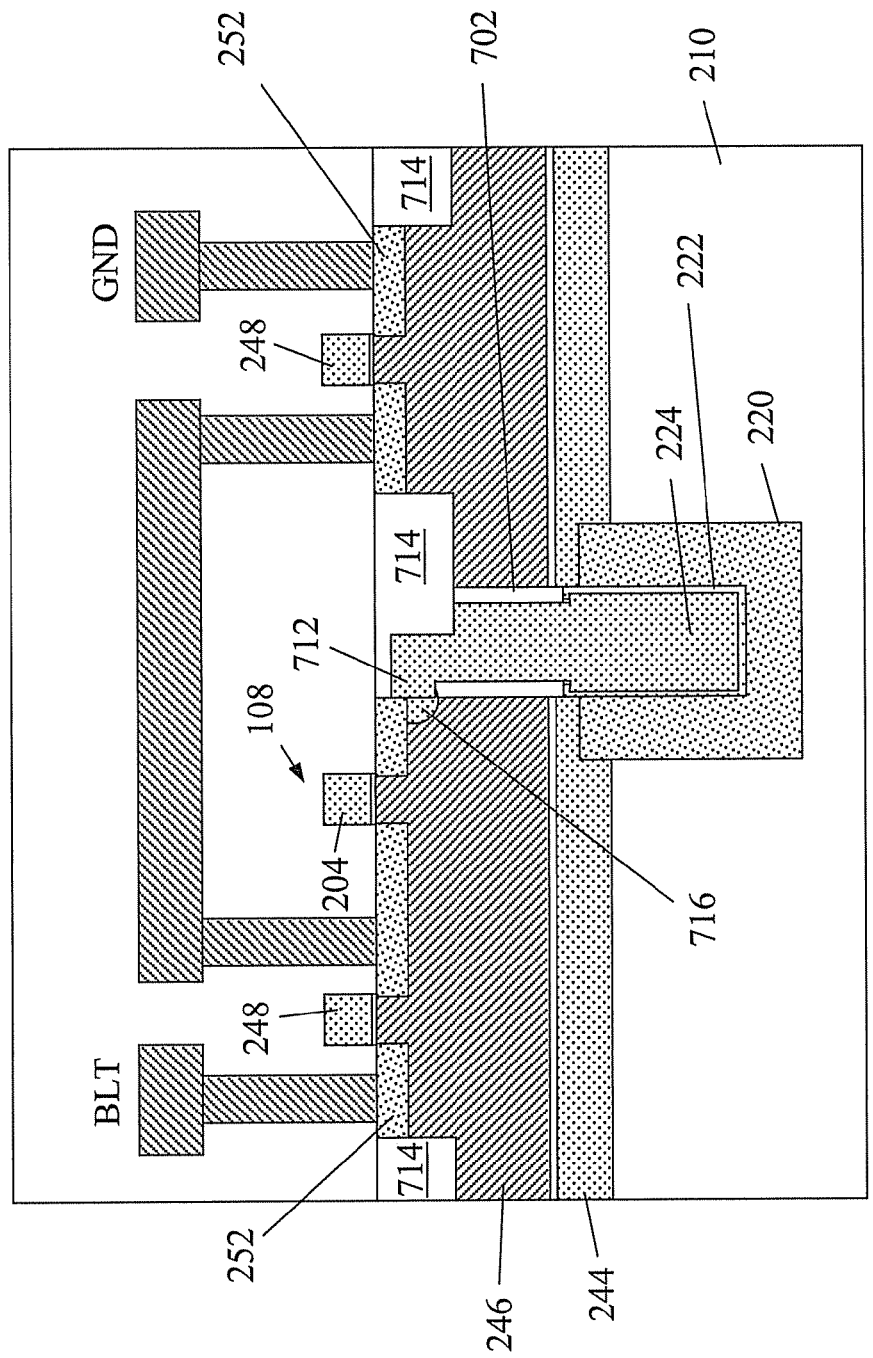

Finally, FIG. 7(f) illustrates a single-layer metallization process similar to that shown in FIGS. 4(j) and (k) and, as such, the details of the same are omitted. Thus configured, the structure of FIG. 7(f) also provides an SEU hardened structure with a switchably added internal node capacitance in a manner that avoids sacrificing performance, and with a simpler process flow than the earlier described embodiment that utilizes a deep trench capacitor/vertical access transistor combination.

Still further inventive embodiments related to the present disclosure include the uses of leaky (e.g., relatively lower threshold voltage, $V_t$) transistors with respect to the other storage device transistors. This may allow for precharging (preconditioning) of the capacitor storage nodes without loading the internal storage latch nodes. A large RC time constant of an off-state leaky access MOSFET and capacitor prevents performance loss during a normal write operation, and avoid an SEU of the latch state when switched into the "protect mode."

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A static random access memory (SRAM) cell, comprising:
    cross coupled first and second complementary metal oxide semiconductor (CMOS) inverters formed on a semiconductor substrate, the CMOS inverters including a first storage node and a second storage node that is the logical complement of the first storage node;
    a first access transistor coupled between the first storage node and a true data bit line, and a second access transistor coupled between the second storage node and a complement data bit line, the first and second access transistors activated by a word line coupled to gate conductors thereof;

both of the first and second storage nodes each further selectively coupled to a deep trench capacitor through a switching transistor, with the switching transistors controlled by a common capacitance switch line coupled to gate conductors thereof;

the common capacitance switch line disposed directly above the deep trench capacitors at a first metal level, with the word line and true and complementary data bit lines disposed at a second metal level above the first metal level;

wherein, in a first mode of operation, the switching transistors are rendered nonconductive so as to isolate the deep trench capacitors from the inverter storage nodes and, in a second mode of operation, the switching transistors are rendered conductive so as to couple the deep trench capacitors to their respective storage nodes, thereby providing increased resistance of the storage nodes to single event upsets (SEUs).

2. The SRAM cell of claim 1, wherein the switching transistors comprise vertical switching transistors.

3. The SRAM cell of claim 2, wherein the gate conductors of the vertical switching transistors are disposed within the same deep trench corresponding to the deep trench capacitor associated therewith.

* * * * *